(12) United States Patent
Bak et al.

(10) Patent No.: US 10,504,959 B2
(45) Date of Patent: Dec. 10, 2019

(54) SEMICONDUCTOR MEMORY DEVICE

(71) Applicants: Junghoon Bak, Suwon-si (KR); Kwangil Shin, Seoul (KR)

(72) Inventors: Junghoon Bak, Suwon-si (KR); Kwangil Shin, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/696,144

(22) Filed: Sep. 5, 2017

(65) Prior Publication Data

US 2018/0211995 A1 Jul. 26, 2018

(30) Foreign Application Priority Data

Jan. 20, 2017 (KR) .................. 10-2017-0009975

(51) Int. Cl.
*H01L 27/22* (2006.01)
*H01L 43/12* (2006.01)
*H01L 43/08* (2006.01)
*H01L 21/768* (2006.01)

(52) U.S. Cl.
CPC ............ *H01L 27/228* (2013.01); *H01L 43/12* (2013.01); *H01L 21/76813* (2013.01); *H01L 21/76816* (2013.01); *H01L 43/08* (2013.01)

(58) Field of Classification Search
CPC . H01L 27/0688; H01L 27/222; H01L 27/228; H01L 23/535; H01L 21/76807; H01L 21/76816; H01L 21/823475; H01L 2221/1015; H01L 43/08; H01L 43/12
See application file for complete search history.

(56) References Cited

U.S. PATENT DOCUMENTS

| 8,138,562 | B2 | 3/2012 | Mao |
| 8,542,524 | B2 | 9/2013 | Keshtbod et al. |
| 8,558,297 | B2 | 10/2013 | Liaw et al. |
| 9,159,910 | B2 | 10/2015 | Kang et al. |
| 9,543,357 | B2 | 1/2017 | Ko et al. |
| 9,576,846 | B2 | 2/2017 | Lee |
| 9,595,561 | B2 | 3/2017 | Lee |
| 2005/0189577 | A1* | 9/2005 | Wang ............... H01L 28/55 257/303 |

(Continued)

FOREIGN PATENT DOCUMENTS

JP 4439341 B2 3/2010

*Primary Examiner* — David C Spalla
(74) *Attorney, Agent, or Firm* — Renaissance IP Law Group LLP

(57) ABSTRACT

A lower dielectric layer is disposed on a semiconductor substrate. A plurality of peripheral lower wirings are disposed on a peripheral region of the semiconductor substrate and in the lower dielectric layer. An upper dielectric layer is disposed on the lower dielectric layer and covers the plurality of peripheral lower wirings. A mold layer is disposed on the upper dielectric layer and includes an etching stopper layer. A peripheral upper wiring penetrates the mold layer and the upper dielectric layer to be connected to at least one of the plurality of peripheral lower wirings. The peripheral upper wiring includes a wiring portion, a first via portion extending downwardly from a bottom surface of the wiring portion, and a second via portion extending downwardly from the bottom surface of the wiring portion.

20 Claims, 23 Drawing Sheets

(56) References Cited

U.S. PATENT DOCUMENTS

| | | | |
|---|---|---|---|
| 2005/0189612 A1* | 9/2005 | Hung | H01L 21/76807 257/529 |
| 2009/0261433 A1* | 10/2009 | Kang | H01L 43/08 257/421 |
| 2011/0089507 A1* | 4/2011 | Mao | H01L 27/222 257/421 |
| 2011/0089511 A1 | 4/2011 | Keshtbod et al. | |
| 2012/0170358 A1 | 7/2012 | Liaw et al. | |
| 2012/0309196 A1* | 12/2012 | Mi | H01L 21/31116 438/702 |
| 2014/0042508 A1 | 2/2014 | Lee | |
| 2015/0017742 A1* | 1/2015 | Lee | H01L 27/228 438/3 |
| 2016/0020249 A1 | 1/2016 | Ko et al. | |
| 2016/0268336 A1 | 9/2016 | Shum et al. | |
| 2016/0276406 A1 | 9/2016 | Satoh et al. | |
| 2017/0092852 A1* | 3/2017 | Son | H01L 43/12 |

* cited by examiner

SEMICONDUCTOR MEMORY DEVICE

CROSS-REFERENCE TO RELATED APPLICATION

This application claims priority under 35 U.S.C. § 119 to Korean Patent Application No. 10-2017-0009975 filed on Jan. 20, 2017 in the Korean Intellectual Property Office, the disclosure of which is incorporated by reference herein in its entirety.

TECHNICAL FIELD

The present inventive concept relates to a semiconductor memory device.

DISCUSSION OF RELATED ART

Portable computing devices and wireless communication devices use nonvolatile memory devices as storage. Magnetic memory devices are nonvolatile, using a tunnel magnetoresistance (TMR) effect as a data storage mechanism.

SUMMARY

According to an exemplary embodiment of the present inventive concept, a semiconductor memory device is provided as follows. A semiconductor substrate includes a cell region and a peripheral region. A lower dielectric layer is disposed on the semiconductor substrate. A plurality of peripheral lower wirings are disposed on the peripheral region of the semiconductor substrate and in the lower dielectric layer. An upper dielectric layer is disposed on the lower dielectric layer and covers the plurality of peripheral lower wirings. A mold layer is disposed on the upper dielectric layer. The mold layer includes an etching stopper layer. A peripheral upper wiring penetrates the mold layer and the upper dielectric layer to be connected to at least one of the plurality of peripheral lower wirings. The peripheral upper wiring includes a wiring portion, a first via portion extending downwardly from a bottom surface of the wiring portion, and a second via portion extending downwardly from the bottom surface of the wiring portion. The bottom surface of the wiring portion is lower than the etching stopper layer of the mold layer.

According to an exemplary embodiment of the present inventive concept, a semiconductor memory device is provided as follows. A semiconductor substrate includes a cell region and a peripheral region. A lower dielectric layer is disposed on the semiconductor substrate. A cell lower wiring is disposed on the cell region of the semiconductor substrate and in the lower dielectric layer. A peripheral lower wiring is disposed on the peripheral region of the semiconductor substrate and in the lower dielectric layer. A first stacked structure of a lower contact plug, a data storage pattern, and a bit line, stacked as listed, is disposed on the cell lower wiring. A peripheral upper wiring is disposed on the peripheral lower wiring. A thickness of the first stacked structure and a thickness of the peripheral upper wiring are substantially the same. The peripheral upper wiring includes a wiring portion, and at least two via portions extended downwardly from a bottom surface of the wiring portion toward the peripheral lower wiring. A thickness of the wiring portion is greater than a thickness of the bit line.

According to an exemplary embodiment of the present inventive concept, a semiconductor memory device is provided as follows. A semiconductor substrate includes a cell region and a peripheral region. A lower dielectric layer is disposed on the semiconductor substrate. A peripheral lower wiring is disposed on the peripheral region of the semiconductor substrate and in the lower dielectric layer. A protective insulating layer is disposed on the lower dielectric layer. An etching stopper layer is disposed on the protective insulating layer. A peripheral upper wiring is disposed on the peripheral lower wiring and penetrates the etching stopper layer and the protective insulating layer. The peripheral upper wiring includes a wiring portion and at least two via portions extended downwardly from a bottom surface of the wiring portion toward the peripheral lower wiring.

DETAILED DESCRIPTION OF EXEMPLARY EMBODIMENTS

Figure 1:
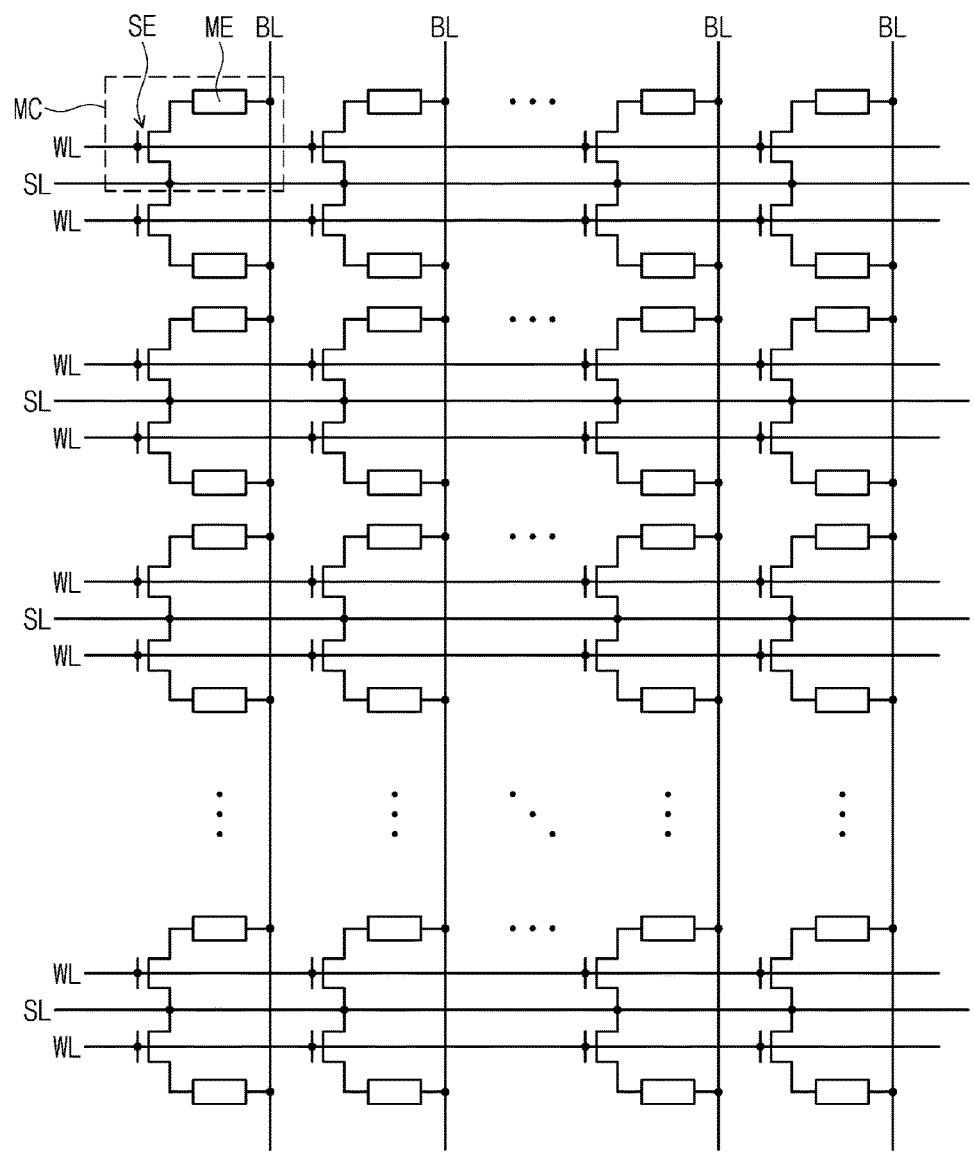
FIG. 1 illustrates a memory cell array of a semiconductor memory device according to an exemplary embodiment of the present inventive concept.

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

The values such as thickness and width or the material of a constituent element may be expressed using "substantially the same" or "about", because the values or the material composition measured in a semiconductor device fabricated according to the present inventive concept may be different from the exact value or material claimed below due to a process variation for forming the semiconductor device or due to a measurement error.

FIG. 1 illustrates a memory cell array of a semiconductor memory device according to an exemplary embodiment.

Referring to FIG. 1, a plurality of unit memory cells MC may be arranged in two dimensions or three dimensions to form a memory cell array. The unit memory cells MC may each be connected between a word line WL and a bit line BL crossing each other. The unit memory cells MC may each include a memory element ME and a selection element SE. The selection element SE and the memory element ME may be electrically connected in series.

The memory element ME may be connected between the bit line BL and the selection element SE. The selection element SE may be disposed between the memory element ME and a source line SL and may be controlled by the word line WL. The memory element ME may be a variable resistance element having two resistance states switched by an electrical pulse applied to the memory element ME. The memory element ME may have a thin film structure where an electrical resistance may be changed using a spin transfer by current passing therethrough. The memory element ME may have a thin film structure having a magnetoresistance characteristic. The memory element ME may include at least one ferromagnetic material or at least one antiferromagnetic material.

The selection element SE may be configured to selectively control supply of current to the memory element ME depending on voltages of the word lines WL. The selection element SE may be, for example, one of a diode, a PNP bipolar transistor, an NPN bipolar transistor, an N-type Metal-Oxide-Semiconductor field effect transistor (NMOS FET), and a P-type MOS field effect transistor (PMOS FET). For example, when the selection element SE is the bipolar transistor or the MOS field effect transistor which has a three-terminal element, the memory cell array may further include the source line SL connected to a source electrode of the transistor. The source line SL may be disposed between adjacent word lines WL such that two transistors may share one source line SL.

Figure 2:
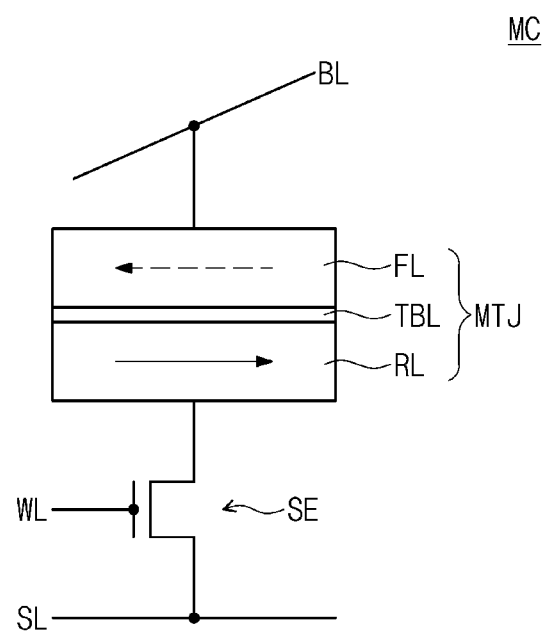
FIG. 2 illustrates a unit memory cell of a semiconductor memory device according to an exemplary embodiment of the present inventive concept.

FIG. 2 illustrates a unit memory cell of a semiconductor memory device according to an exemplary embodiment.

Referring to FIG. 2, a unit memory cell MC may include the memory element ME and the selection element SE. The selection element SE may be an MOS field effect transistor, and the memory element ME may include a magnetic tunnel junction MTJ. The magnetic tunnel junction MTJ may be connected between the bit line BL and the selection element SE. The selection element SE may be connected between the magnetic tunnel junction MTJ and the source line SL and may be controlled by the word line WL.

The magnetic tunnel junction MTJ may include a plurality of magnetic layers FL and RL and a tunnel barrier layer TBL between the magnetic layers FL and RL. One magnetic layer RL of the magnetic layers FL and RL may be a reference layer having a fixed magnetization direction regardless of an external magnetic field or a spin transfer torque in a normal use environment. The other magnetic layer FL may be a free layer where a magnetization direction is changed by the external magnetic field.

The magnetic tunnel junction MTJ may store data in the unit memory cell MC using a difference in an electrical resistance depending on the magnetization directions of the magnetic layers FL and RL. The electrical resistance of the magnetic tunnel junction MTJ may be adjusted by changing the magnetization direction of the free layer FL. The electrical resistance of the magnetic tunnel junction MTJ may be greater when the magnetization directions of the reference layer RL and the free layer FL are antiparallel than when the magnetization directions of the reference layer RL and the free layer FL are parallel.

Figure 3:
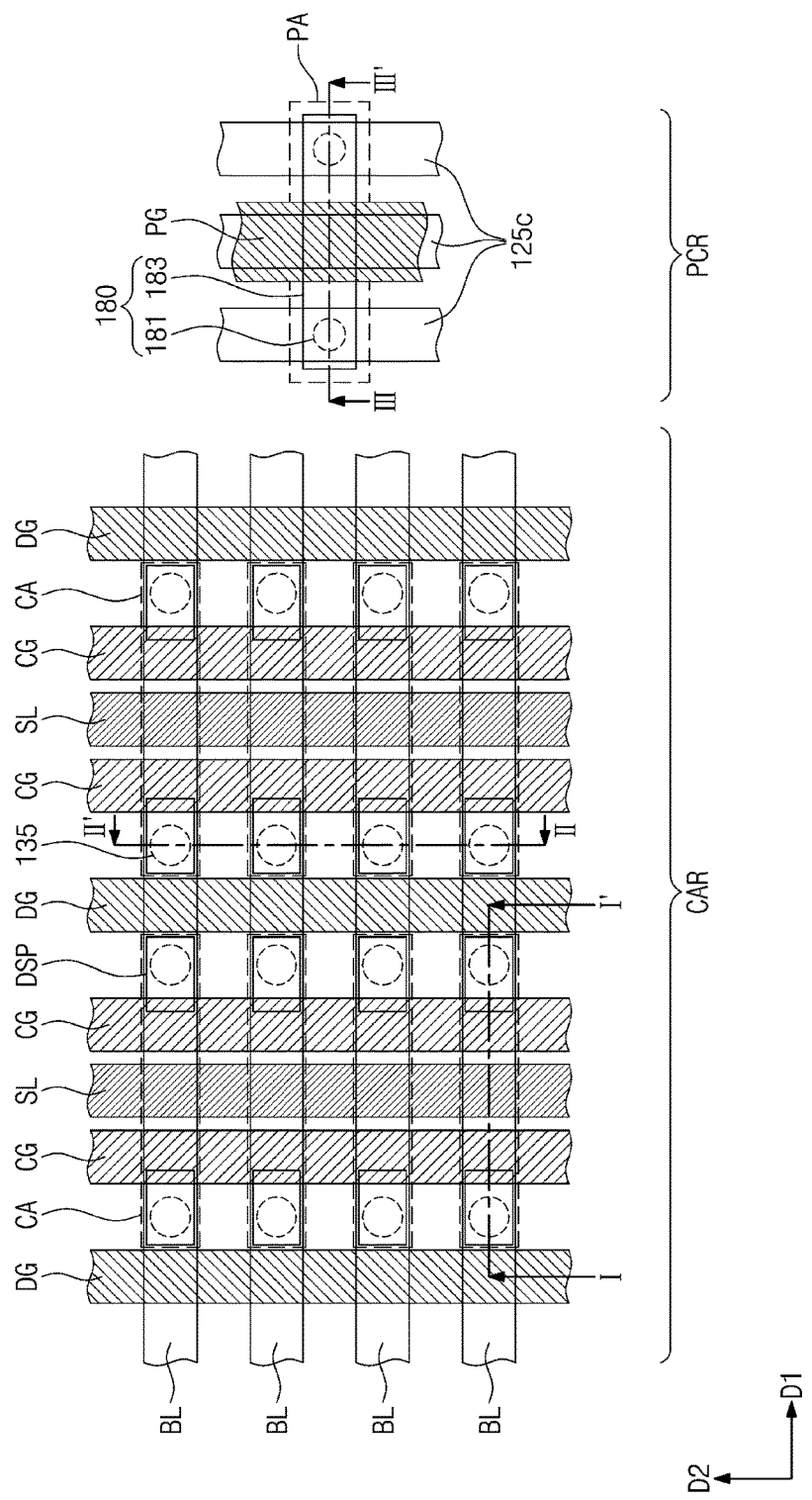
FIG. 3 is a layout illustrating a semiconductor memory device according to an exemplary embodiment of the present inventive concept.

FIG. 3 is a layout illustrating a semiconductor memory device according to an exemplary embodiment. FIGS. 4 to 16 are cross-sectional views taken along lines I-I', II-II' and of FIG. 3 to illustrate a method of manufacturing a semiconductor memory device according to an exemplary embodiment. FIGS. 17A, 17B and 17C are enlarged views illustrating portion A of FIG. 16 according to an exemplary embodiment.

Figure 4:
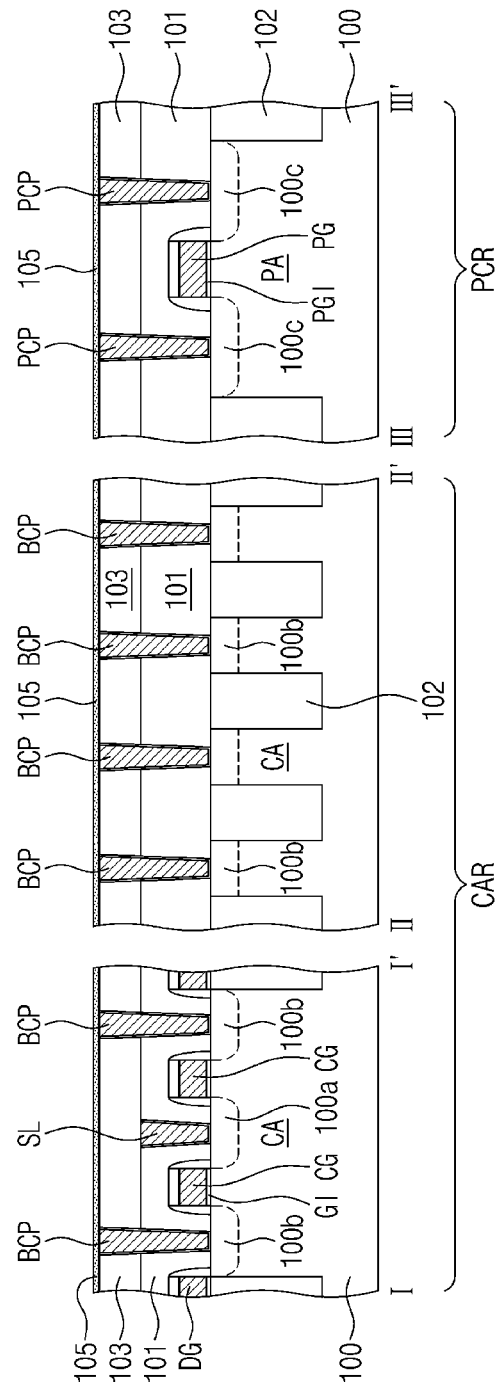
FIGS. 4 to 16 are cross-sectional views taken along lines I-I', II-II' and of FIG. 3 to illustrate a method of manufacturing a semiconductor device according to an exemplary embodiment of the present inventive concept.

Referring to FIGS. 3 and 4, a semiconductor substrate 100 may include a cell region CAR and a peripheral region PCR. The cell region CAR may include a plurality of memory cells. The peripheral region PCR may include a plurality of peripheral circuits.

An isolation layer 102 defining cell active patterns CA may be formed in the semiconductor substrate 100. The semiconductor substrate 100 may include a silicon substrate, a germanium substrate, or a silicon-germanium substrate. The cell active patterns CA may each be defined by the isolation layer 102. For example, the cell active patterns CA may be electrically isolated from each other by the isolation layer 102. The cell active patterns CA may each have a linear shape having a major axis parallel to a first direction D1.

The cell active patterns CA may each extend in the first direction D1. The cell active patterns CA may be doped with dopants of a first conductivity type.

Cell gate electrodes CG and dummy gate electrodes DG may be disposed on the cell region CAR of the semiconductor substrate 100 to intersect the cell active patterns CA and the isolation layer 102.

The cell gate electrodes CG and the dummy gate electrodes DG may each have a linear shape extending in a second direction D2 crossing the cell active patterns CA. The second direction D2 may cross the first direction D1. A gate hard mask pattern formed of an insulating material may be disposed on each of cell gate electrodes CG and each of dummy gate electrodes DG.

The cell gate electrodes CG and the dummy gate electrodes DG may include a doped semiconductor material (e.g., doped silicon), a metal (e.g., tungsten, aluminum, titanium or tantalum), a conductive metal nitride (e.g., titanium nitride, tantalum nitride or tungsten nitride), or a metal-semiconductor compound (e.g., metal silicide), or a combination thereof. The gate hard mask pattern may include oxide (e.g., silicon oxide), nitride (e.g., silicon nitride), or oxynitride (e.g., silicon oxynitride), or a combination thereof.

A gate insulating layer GI may be disposed between the semiconductor substrate 100 and the cell gate electrode CG and between the semiconductor substrate 100 and the dummy gate electrode DG. The gate insulating layer GI may include oxide (e.g., silicon oxide), nitride (e.g., silicon nitride), oxynitride (e.g., silicon oxynitride), or a high-k dielectric material (e.g., insulating metal oxide such as hafnium oxide and aluminum oxide), or a combination thereof.

A peripheral gate electrode PG may be disposed on the peripheral region PCR of the semiconductor substrate 100. The peripheral gate electrode PG may cross a peripheral active pattern PA and may be formed of the same conductive material as the cell gate electrodes CG. In an exemplary embodiment, the peripheral gate electrode PG and the cell gate electrodes CG may be formed at substantially the same time on the semiconductor substrate 100.

A peripheral gate insulating layer PGI may be disposed between the semiconductor substrate 100 and the peripheral gate electrode PG and may be formed of substantially the same insulating material as the gate insulating layer GI. The gate hard mask pattern made of the insulating material may be disposed on the peripheral gate electrode PG.

Gate spacers 123 may be disposed on opposite sidewalls of the cell gate electrode CG, the dummy gate electrode DG and the peripheral gate electrode PG, respectively.

First impurity regions 100a may be disposed in the cell active patterns CA at one side of each cell gate electrode CG. Second impurity regions 100b may be disposed in the cell active patterns CA at another side of each cell gate electrode CG. The first impurity regions 100a and the second impurity regions 100b may be doped with dopants of a second conductivity type different from the first conductivity type. One of the first and second conductivity types may be an n-type, and the other may be a p-type.

The first impurity region 100a and the second impurity region 100b may function as source/drain regions of the selection transistor SE (refer to FIGS. 1 and 2). The cell gate electrode CG, the gate insulating layer GI, the first impurity regions 100a, and the second impurity regions 100b may form the selection transistor SE (refer to FIGS. 1 and 2) of the semiconductor memory device.

The first impurity regions 100a may be disposed between two cell gate electrodes CG in each cell active pattern CA. Two second impurity regions 100b may be disposed at opposite edge regions of each cell active pattern CA. The two cell gate electrodes CG may be disposed between the two second impurity regions 100b. Thus, two of the cell transistors in each cell active pattern CA may share the first impurity region 100a.

Peripheral impurity regions 100c may be disposed in the peripheral pattern PA at opposite sides of the peripheral gate electrode PG. The peripheral impurity regions 100c may be doped with dopants of a different conductivity type from that of the peripheral active pattern PA. The peripheral impurity regions 100c, the peripheral gate insulating layer PGI, and the peripheral gate electrode PG may form a peripheral transistor. The peripheral transistor may be a PMOS transistor or an NMOS transistor.

A first interlayer insulating layer 101 may be disposed on the semiconductor substrate 100. The source lines SL may be formed in the first interlayer insulating layer 101 and may extend in the second direction D2. The source lines SL may be formed by patterning the first interlayer insulating layer 101 on the cell region CAR to form source trenches exposing the first impurity regions 100a and then filling the source tranches with a conductive material.

The source lines SL may each be disposed between two cell gate electrodes CG adjacent to each other when viewed in plan. The source lines SL may each be electrically connected to the first impurity regions 100a arranged along the second direction D2. The source lines SL may have upper surfaces that are coplanar with an upper surface of the first interlayer insulating layer 101 at substantially the same height from the semiconductor substrate 100.

A second interlayer insulating layer 103 may be disposed on the first interlayer insulating layer 101. The second interlayer insulating layer 103 may cover the upper surfaces of the source lines SL. The second interlayer insulating layer 103 may be formed of an insulating material having etch selectivity with respect to the first interlayer insulating layer 101. When the source lines SL include metal, the second interlayer insulating layer 103 may be formed of an insulating material that prevents metal atoms in the source lines SL from diffusing into the second interlayer insulating layer 103. For example, the first interlayer insulating layer 101 may be formed of oxide (e.g., silicon oxide). The second interlayer insulating layer 103 may be formed of nitride (e.g., silicon nitride) or oxynitride (e.g., silicon oxynitride).

Buried contact plugs BCP may penetrate the second interlayer insulating layer 103 and the first interlayer insulating layer 101 on the cell region CAR. Peripheral contact plugs PCP may penetrate the second interlayer insulating layer 103 and the first interlayer insulating layer 101 on the peripheral region PCR.

The buried contact plugs BCP may be electrically connected to the second impurity regions 100b, respectively. The peripheral contact plugs PCP may be electrically connected to the peripheral impurity regions 100c, respectively.

According to an exemplary embodiment, the source lines SL, the buried contact plugs BCP and the peripheral contact plugs PCP may include a first metal material. For example, the first metal material may include, metal such as tungsten, titanium and tantalum, or conductive metal nitride such as titanium nitride, tantalum nitride and tungsten nitride. In an exemplary embodiment, the source lines SL, the buried contact plugs BCP, and the peripheral contact plugs PCP may include doped semiconductor material.

A capping interlayer insulating layer 105 may be formed on the second interlayer insulating layer 103 and may cover upper surfaces of the buried contact plugs BCP and the peripheral contact plugs PCP.

The capping interlayer insulating layer 105 may be formed of an insulating material having etch selectivity with respect to the second interlayer insulating layer 103. For example, the capping interlayer insulating layer 105 may be formed of nitride (e.g., silicon nitride), or oxynitride (e.g., silicon oxynitride).

Figure 5:
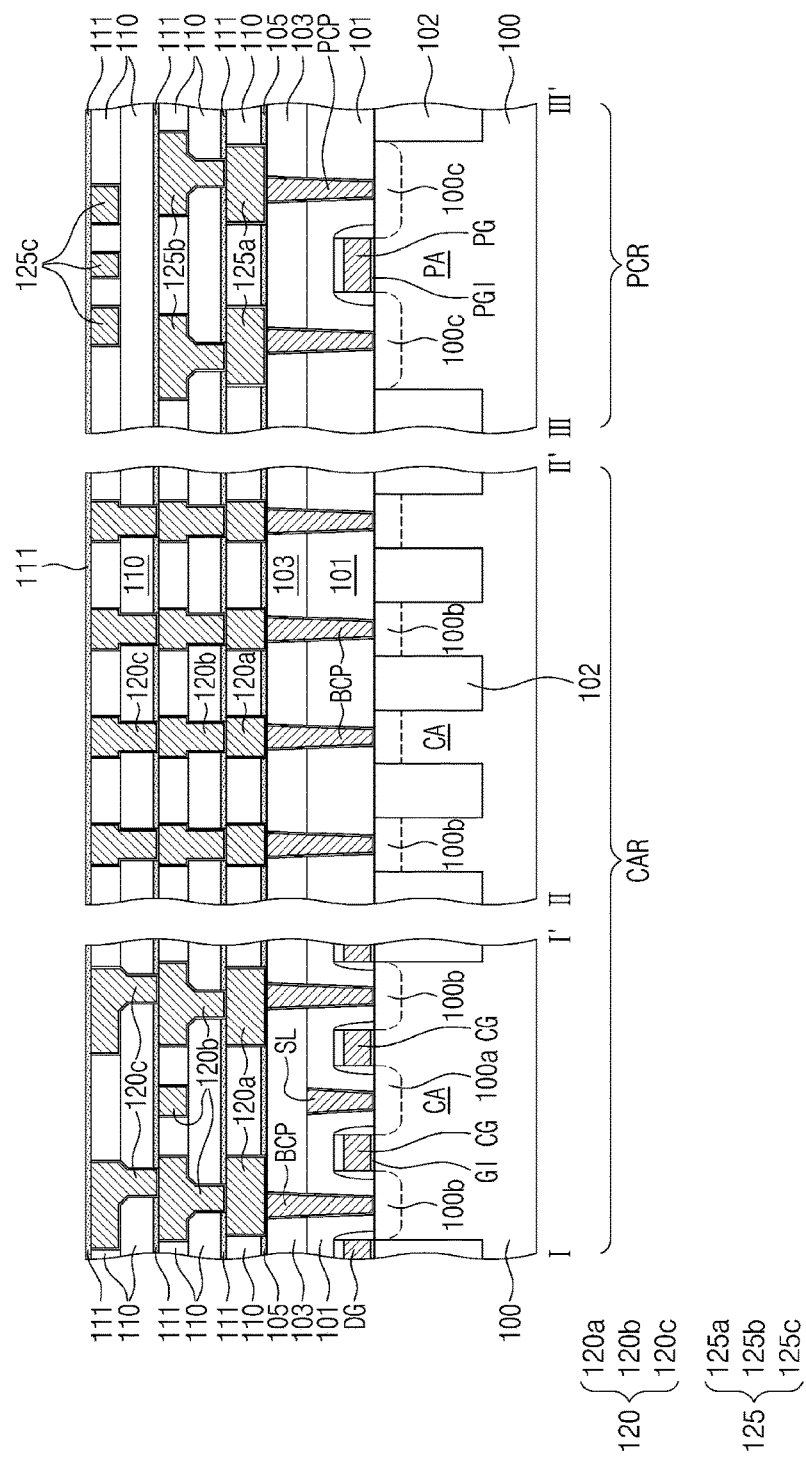

Referring to FIGS. 3 and 5, cell lower wirings 120 may be vertically stacked on the capping interlayer insulating layer 105 on the cell region CAR, and peripheral lower wirings 125 may be vertically stacked on the capping interlayer insulating layer 105 on the peripheral region PCR. The cell lower wirings 120 may include first cell lower wirings 120a, second cell lower wirings 120b, and third cell lower wirings 120c. The peripheral lower wirings 125 may include first peripheral lower wirings 125a, second peripheral lower wirings 125b, and third peripheral lower wirings 125c.

A plurality of lower dielectric layers 110 may be stacked on the capping interlayer insulating layer 105 that is disposed on the cell region CAR and the peripheral region PCR. The cell lower wirings 120 may be formed in the lower dielectric layers 110 disposed on the cell region CAR. The peripheral lower wirings 125 may be formed in the lower dielectric layers 110 disposed on the peripheral region PCR. The lower dielectric layers 110 may be formed of a dielectric material having a dielectric constant lower than that of silicon oxide. For example, the lower dielectric layers 110 may be formed of fluorine-doped oxide (or FSG), carbon-doped oxide, silicon oxide, hydrogen silsesquioxane (HSQ, SiO:H), methyl silsesquioxane (MSQ, SiO:CH3), or amorphous hydrogenated carbon doped oxide (a-SiOC, SiOC:H).

Diffusion preventing layers 111 may be interposed between the lower dielectric layers 110. An uppermost layer of the diffusion preventing layers 111 may cover upper surfaces of the third cell lower wirings 120c that are uppermost layers of the cell lower wirings 120, upper surfaces of the third peripheral lower wirings 125c that are uppermost wiring layers of the peripheral lower wirings 125, and an upper surface of an uppermost layer of the lower dielectric layers 110. The diffusion preventing layers 111 may be formed of silicon nitride (SiN), silicon oxynitride (SiON), silicon carbide (SiC), silicon carbonitride (SiCN), or a combination thereof.

The cell lower wirings 120 may be electrically connected to the buried contact plugs BCP or the source lines SL. Thus, the cell lower wirings 120 may be electrically connected to the selection transistors SE of FIG. 1. The first cell lower wirings 120a, the second cell lower wirings 120b, the third cell lower wirings 120c may be vertically stacked on the second interlayer insulating layer 103. The first cell lower wirings 120a that are the lowermost wirings may be in direct contact with the buried contact plugs BCP. The second cell lower wirings 120b and the third cell lower wirings 120c may each include a wiring portion and a via portion extending downwardly from a bottom surface of the wiring portion.

The peripheral lower wirings 125 may be electrically connected to the peripheral transistor through the peripheral contact plugs PCP. The peripheral lower wirings 125 may be concurrently formed with the cell lower wirings 120. The first peripheral lower wirings 125a, the second peripheral lower wirings 125b, the third peripheral lower wirings 125c may be vertically stacked on the second interlayer insulating layer 103. The first peripheral lower wirings 125a that are lowermost wirings may directly contact the peripheral contact plugs PCP. The second peripheral lower wirings 125b and third peripheral lower wirings 125c may each include a wiring portion and a via portion extending downwardly from a bottom surface of the wiring portion. The third peripheral lower wirings 125c may be electrically connected to the second peripheral lower wirings 125b through the via portions (not shown) thereof. Upper surfaces of the third peripheral lower wirings 125c may be coplanar with upper surfaces of the third cell lower wirings 120c at substantially the same height from the semiconductor substrate 100.

In an exemplary embodiment, the cell lower wirings 120 and the peripheral lower wirings 125 may include a second metal material different from the first metal material of the buried contact plugs BCP and the peripheral contact plugs PCP. The second metal material may have a resistivity lower than that of the first metal material. For example, the second metal material may include metal such as copper and a copper alloy. Herein, the copper alloy may include an element or combination of elements, for example, C, Ag, Co, Ta, In, Sn, Zn, Mn, Ti, Mg, Cr, Ge, Sr, Pt, Mg, Al, or Zr other than copper.

Figure 6:
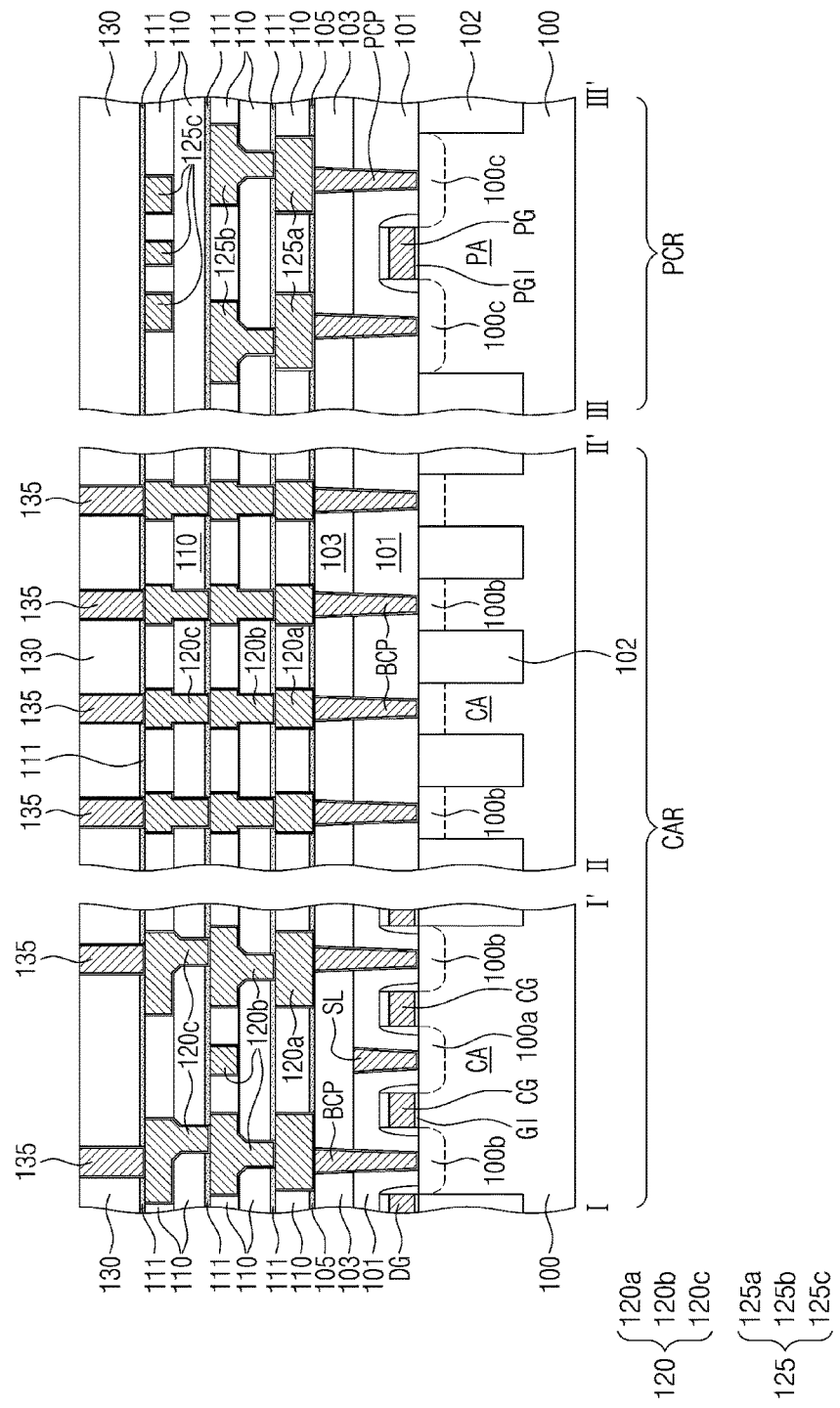

Referring to FIGS. 3 and 6, an upper dielectric layer 130 may be formed on the uppermost layer of the diffusion preventing layers 111. The upper dielectric layer 130 may be formed of high-density-plasma (HDP) oxide, Tetraethyl orthosilicate (TEOS), plasma enhanced TEOS (PE-TEOS), undoped silicate glass (USG), borosilicate glass (BSG), phosphosilicate glass (PSG), borophosphosilicate glass (BPSG), spin-on glass (SOG), Tonen SilaZene (TOSZ), or a combination thereof. The upper dielectric layer 130 may be formed of a dielectric material having a dielectric constant lower than that of silicon oxide.

Lower contact plugs 135 may be formed to penetrate the upper dielectric layer 130 disposed on the cell region CAR. The lower contact plugs 135 may be electrically connected to the second impurity regions 100b, respectively, through the cell lower wirings 120 and the buried contact plugs BCP. The lower contact plugs 135 may each include a barrier metal pattern 135a and a metal pattern 135b as shown in FIGS. 17A to 17C.

The lower contact plugs 135 may be formed of a third metal material different from the second metal material of the cell lower wirings 120. The third metal material may have a resistivity greater than that of the second metal material. The third metal material may include, for example, a metal such as tungsten, titanium and tantalum, or a conductive metal nitride such as titanium nitride, tantalum nitride, and tungsten nitride. In an exemplary embodiment, the metal pattern 135b of FIGS. 17A to 17C may include the metal of the third metal material, and the barrier metal pattern 135a of FIGS. 17A to 17C may include the conductive metal nitride of the third metal material. The present inventive concept is not limited thereto. For example, the lower contact plugs 135 may include substantially the same material as the buried contact plugs BCP.

Figure 7:
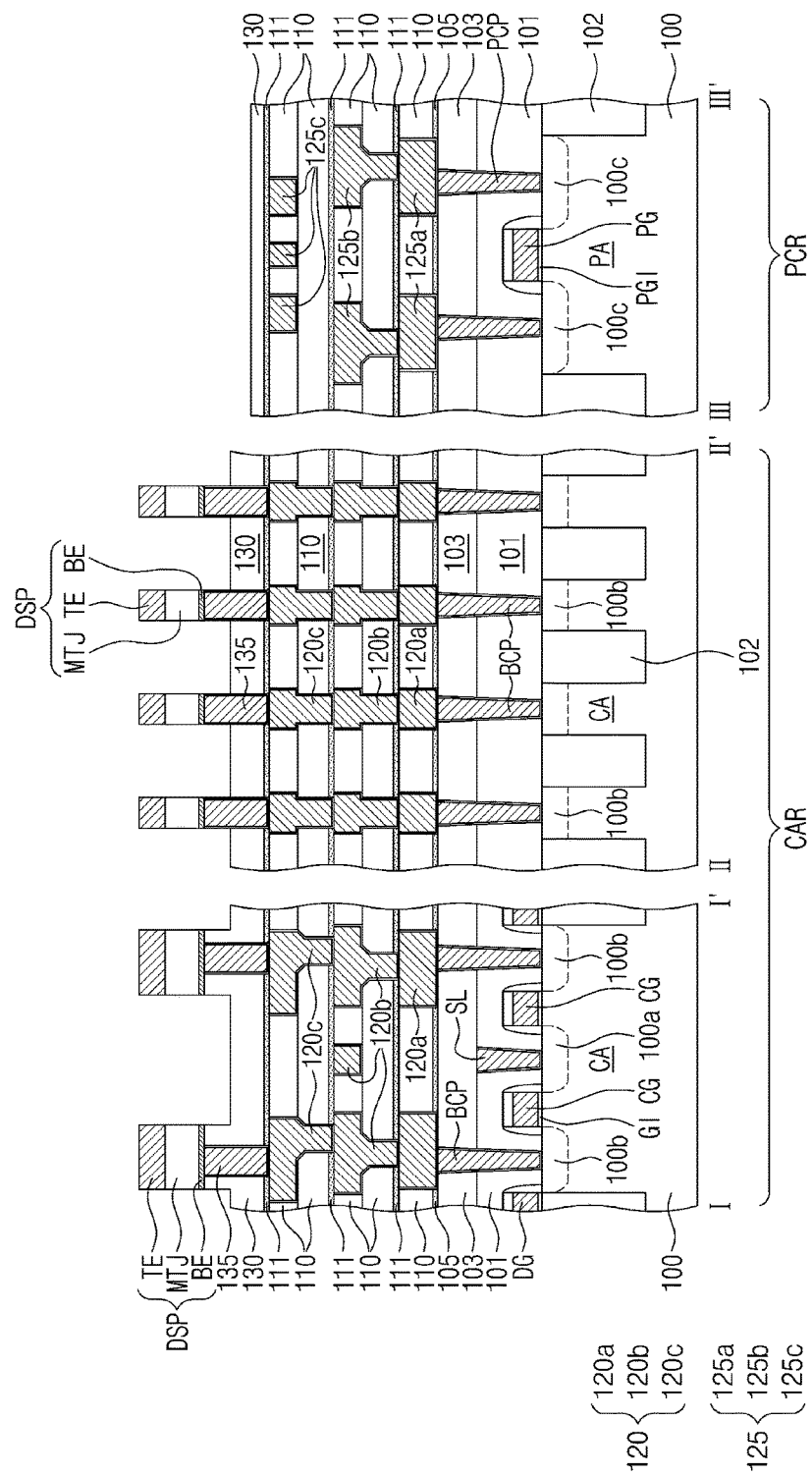

Referring to FIGS. 3 and 7, data storage patterns DSP may be formed on the upper dielectric layer 130 that is disposed on the cell region CAR of the semiconductor substrate 100. The data storage patterns DSP may be arranged to be spaced apart from each other in the first direction D1 and the second direction D2 when viewed in plan. The data storage patterns DSP may be connected to the lower contact plugs 135, respectively. The data storage patterns DSP may be electrically connected to the second impurity regions 100b, respectively, through the lower contact plugs 135, the cell lower wirings 120 and the buried contact plugs BCP. Thus, the data storage patterns DSP may be electrically connected to the selection transistors SE (refer to FIG. 1), respectively.

The formation of data storage patterns DSP may include sequentially stacking a bottom electrode layer, a lower magnetic layer, a tunnel barrier layer, an upper magnetic layer and a top electrode layer and sequentially etching the top electrode layer, the upper magnetic layer, the tunnel barrier layer, the lower magnetic layer and the bottom electrode layer using an etch mask pattern to expose a portion of the upper dielectric layer 130.

During the etching process of forming the data storage patterns DSP, the upper dielectric layer 130 may be recessed by over-etching. In this case, the upper dielectric layer 130 may be further recessed on the peripheral region PCR than around the data storage patterns DSP due to a loading effect. Thus, after forming the data storage patterns DSP, a thickness of the upper dielectric layer 130 may vary depending on the location of the upper dielectric layer 130. A thickness of the upper dielectric layer 130 that is disposed on the cell region CAR may be greater than a thickness of the upper dielectric layer 130 that is disposed on the peripheral region PCR. An upper surface of the upper dielectric layer 130 that is disposed on the cell region CAR may be higher than an upper surface of the upper dielectric layer 130 that is disposed on the peripheral region PCR from an upper surface of the semiconductor substrate 100.

Furthermore, when forming the data storage patterns DSP, the upper dielectric layer 130 may be recessed such that the upper surface of the upper dielectric layer 130, between the data storage patterns DSP, may be lower than upper surfaces of the lower contact plugs 135, with respect to the upper surface of the semiconductor substrate 100. The upper surface of the upper dielectric layer 130 may be higher, between the data storage patterns DSP, than the upper surface of the upper dielectric layer 130 disposed on the peripheral region PCR, with respect to the upper surface of the semiconductor substrate 100. Since the upper dielectric layer 130 is recessed, portions of sidewalls of the lower contact plugs 135 may be exposed.

The data storage patterns DSP may each include a bottom electrode BE, a top electrode TE and a magnetic tunnel junction pattern MTJ between the bottom electrode BE and the top electrode TE as shown in FIGS. 17A to 17C.

Referring to FIGS. 17A to 17C, the bottom electrode BE may be in contact with the upper surface of each of the lower contact plugs 135. The top electrode TE may be formed thicker than the bottom electrode BE.

The bottom electrode BE may include a conductive metal nitride. For example, the bottom electrode BE may include titanium nitride, tantalum nitride, tungsten nitride, or titanium aluminum nitride. The top electrode TE may include a barrier metal pattern 51 and a metal pattern 53. The barrier metal pattern 51 may include, for example, tantalum, tantalum nitride, tantalum silicon nitride, titanium, titanium nitride, titanium silicon nitride, tungsten, tungsten nitride or a combination thereof. The metal pattern 53 may include, for example, tungsten, titanium, tantalum, ruthenium, platinum, or a combination thereof.

Referring to FIGS. 17A and 17C, the magnetic tunnel junction pattern MTJ may include a lower magnetic pattern RPL, an upper magnetic pattern FPL and a tunnel barrier pattern TBL.

The lower magnetic pattern RPL may function as a pinned layer having a magnetization direction fixed in a direction. The upper magnetic pattern FPL may function as a free layer having a magnetization direction that is changeable to be parallel or antiparallel to the magnetization direction of the pinned layer. The present inventive concept is not limited thereto. For example, the lower magnetic pattern RPL may function as the free layer, and the upper magnetic pattern FPL may function as the pinned layer.

An electrical resistance of the magnetic tunnel junction pattern MTJ may be adjusted by changing the magnetization direction of the free layer. The magnetization direction of the free layer may be adjusted by the spin torques of electrons in a writing current. Thus, the data storage pattern DSP, including the magnetic tunnel junction pattern MTJ, may store data therein using a difference in the electrical resistance depending on the magnetization direction.

The lower and upper magnetic patterns RPL and FPL may include a ferromagnetic material. In an exemplary embodiment, the lower magnetic pattern RPL or the upper magnetic pattern FPL used as the pinned layer may further include an antiferromagnetic material pinning a magnetization direction of the ferromagnetic material in the pinned layer. The tunnel barrier layer TBL may include magnesium oxide, titanium oxide, aluminum oxide, magnesium-zinc oxide or magnesium-boron oxide.

In FIG. 17C, the magnetization directions of the lower and upper magnetic patterns RPL and FPL may be parallel to an upper surface of the tunnel barrier pattern TBL.

In FIG. 17A, the magnetization directions of the lower and upper magnetic patterns RPL and FPL may be vertical to an upper surface of the tunnel barrier pattern TBL. In this case, the lower magnetic patterns RPL and the upper magnetic patterns FPL may each include magnetic layers and non-magnetic layers that are alternately and repeatedly stacked on each other. For example, the lower magnetic patterns RPL and the upper magnetic patterns FPL may include at least one of (Co/Pt)n, (CoFe/Pt)n, (CoFe/Pd)n, (Co/Pd)n, (Co/Ni)n, (CoNi/Pt)n, (CoCr/Pt)n and (CoCr/Pd)n, where n is the number of stacks. Herein, one of the lower magnetic patterns RPL and the upper magnetic patterns FPL used as the pinned layer may be thicker than the other used as the free layer, and a coercivity of the pinned layer may be greater than that of the free layer.

In FIG. 17B, the data storage pattern DSP may include a first pinned magnetic layer RPL1, a first tunnel barrier layer TBL1, a free magnetic layer FPL, a second tunnel barrier layer TBL2 and a second pinned magnetic layer RPL2 that are sequentially stacked. A thickness of the first tunnel barrier layer TBL1 may be different from a thickness of the second tunnel barrier layer TBL2. In the data storage pattern DSP, the first pinned magnetic layer RPL1, the first tunnel barrier layer TBL1 and the free magnetic layer FPL may form a first magnetic tunnel junction. The free magnetic layer FPL, the second tunnel barrier layer TBL2 and the second pinned layer RPL2 may form a second magnetic tunnel junction.

The first pinned magnetic layer RPL1 and the second pinned magnetic layer RPL2 may each have a magnetization direction fixed in a direction. However, the magnetization direction of the first pinned magnetic layer RPL1 may be opposite to the magnetization direction of the second pinned magnetic layer RPL2. The free magnetic layer FPL may have a magnetization direction that is changeable to be parallel or antiparallel to the fixed magnetization direction of the first pinned magnetic layer RPL1 and the second pinned magnetic layer RPL2. The magnetization directions of the first pinned magnetic layer RPL1, the second pinned magnetic layer RPL2 and the free magnetic layer FPL may be substantially vertical to upper surfaces of the first tunnel barrier layer TBL1 and the second tunnel barrier layer TBL2.

Figure 8:
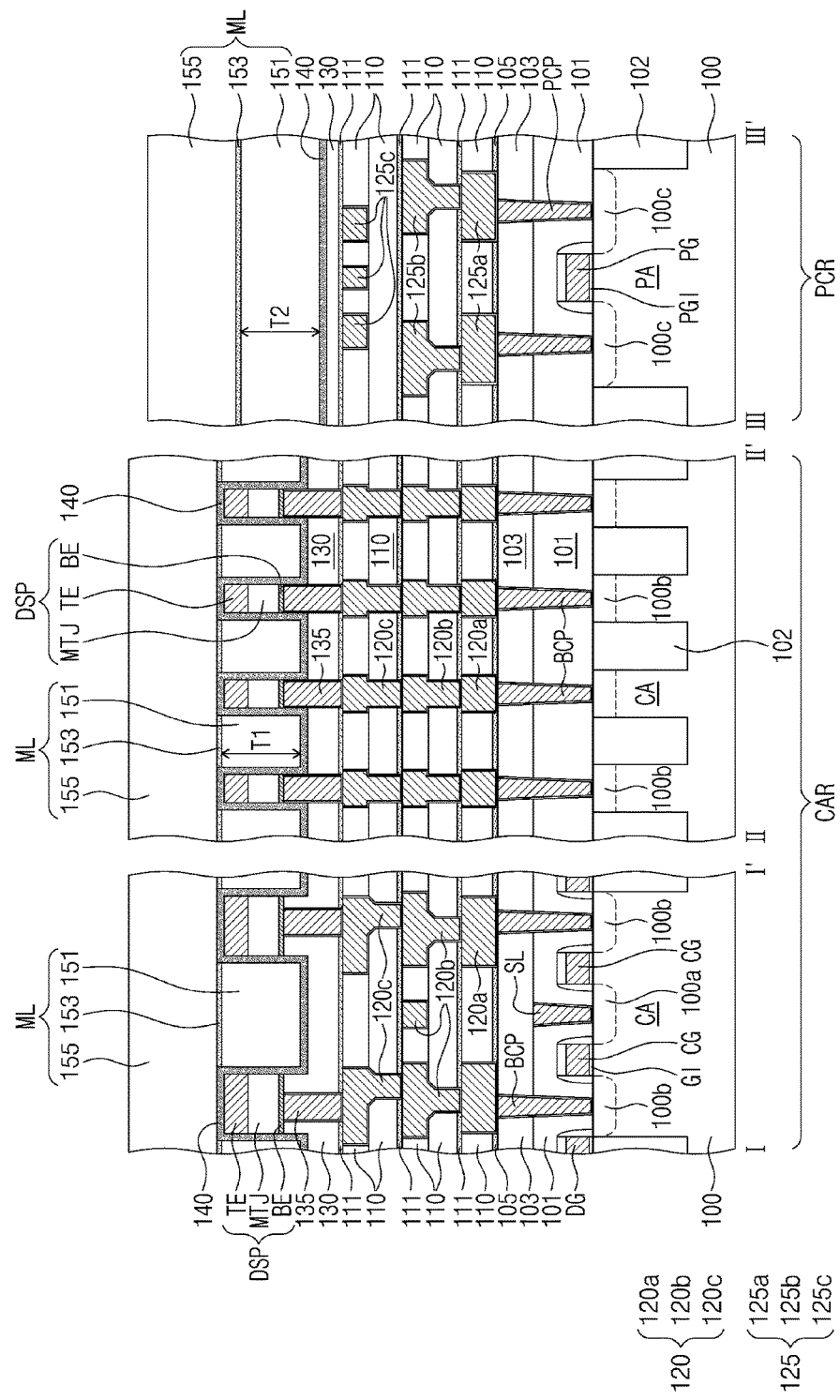

Referring to FIGS. 3 and 8, a protective insulating layer 140 may be formed on the upper dielectric layer 130 to conformally cover the data storage patterns DSP. The protective insulating layer 140 may be in direct contact with sidewalls of the data storage patterns DSP and the portions of the sidewalls of the lower contact plugs 135. The protective insulating layer 140 may be formed of an insulating material having etch selectivity with respect to the upper dielectric layer 130. The protective insulating layer 140 may be formed of, for example, silicon nitride, silicon oxynitride, silicon carbide, silicon carbonitride, or a combination thereof.

After forming the protective insulating layer 140, a mold layer ML may be formed on the semiconductor substrate 100. The mold layer ML may include a first mold layer 151, an etching stopper layer 153 and a second mold layer 155 that are sequentially stacked on the protective insulating layer 140. The first mold layer 151 and the second mold layer 155 may be formed of silicon oxide or a low-k dielectric material having a dielectric constant lower than that of silicon oxide. The etching stopper layer 153 may be formed of an insulating material having etch selectivity with respect to the first mold layer 151 and the second mold layer 155, for example, silicon nitride, silicon oxynitride, silicon carbide, silicon carbonitride or a combination thereof.

The first mold layer 151 may fill spaces between the data storage patterns DSP disposed on the cell region CAR. An upper surface of the first mold layer 151 that is disposed on the peripheral region PCR may be positioned at a level between an upper surface of the top electrode TE and a lower surface of the top electrode TE of the data storage pattern DSP. A first thickness T1 of the first mold layer 151 that is disposed on the cell region CAR may be greater than a second thickness T2 of the first mold layer 151 that is disposed on the peripheral region PCR. The upper surface of the first mold layer 151 that is disposed on the cell region CAR may be higher than the upper surface of the first mold layer 151 that is disposed on the peripheral region PCR with respect to the upper surface of the semiconductor substrate 100.

The etching stopper layer 153 may be formed on the first mold layer 151. On the cell region CAR, an upper surface of the etching stopper layer 153 may be coplanar with an uppermost surface of the protective insulating layer 140 at substantially the same height from the upper surface of the semiconductor substrate 100. The present inventive concept is not limited thereto. For example, the etching stopper layer 153 may cover the uppermost surface of the protective insulating layer 140 on the cell region CAR.

The etching stopper layer 153 may have a substantially uniform thickness on the cell region CAR and the peripheral region PCR of the semiconductor substrate 100. An upper surface of the etching stopper layer 153 that is disposed on the cell region CAR may be higher than an upper surface of the etching stopper layer 153 that is disposed on the peripheral region PCR with respect to the upper surface of the semiconductor substrate 100.

The second mold layer 155 may be formed on the etching stopper layer 153. The second mold layer 155 may have a step between the cell region CAR and the peripheral region PCR. Thus, an upper surface of the second mold layer 155 that is disposed on the cell region CAR may be higher than an upper surface of the second mold layer 155 that is disposed on the peripheral region PCR with respect to the upper surface of the semiconductor substrate 100.

A thickness of the second mold layer 155 may be substantially equal to the thickness of the first mold layer 151. The present inventive concept is not limited thereto. For example, the second mold layer 155 may be thicker than the first mold layer 151.

Figure 9:
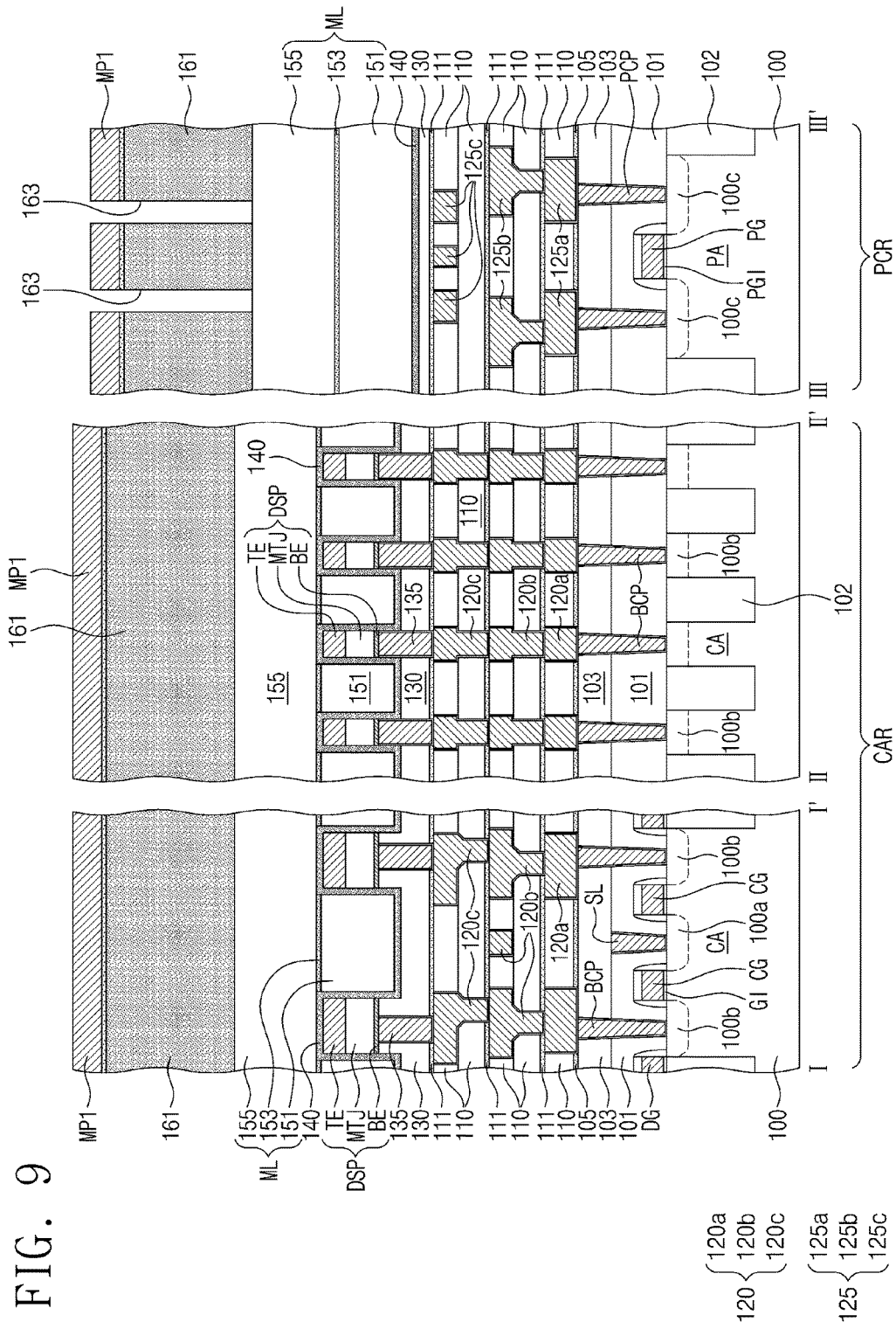

Referring to FIGS. 3 and 9, a first hard mask pattern 161 having openings 163 may be formed on the second mold layer 155. The openings 163 of the first hard mask pattern 161 may expose a portion of the second mold layer 155 that is disposed on the peripheral region PCR.

The first hard mask pattern 161 may be formed by forming a first hard mask layer on the second mold layer 155, forming a first mask pattern MP1 exposing a portion of peripheral region PCR on the first hard mask layer and anisotropically etching the first hard mask layer using the first mask pattern MP1 as an etch mask to expose the second mold layer 155.

The first hard mask pattern 161 may be formed of, for example, a spin-on hard mask (SOH) or an amorphous carbon layer (ACL). The spin-on hard mask (SOH) may include carbon-based SOH or a silicon-base SOH. The present inventive concept is not limited thereto. For example, the first hard mask pattern 161 may be formed of amorphous silicon or polysilicon.

When forming the first hard mask pattern 161, a thickness of the first mask pattern MP1 may be reduced. After forming the first hard mask pattern 161, the first mask pattern MP1 may be removed.

Figure 10:
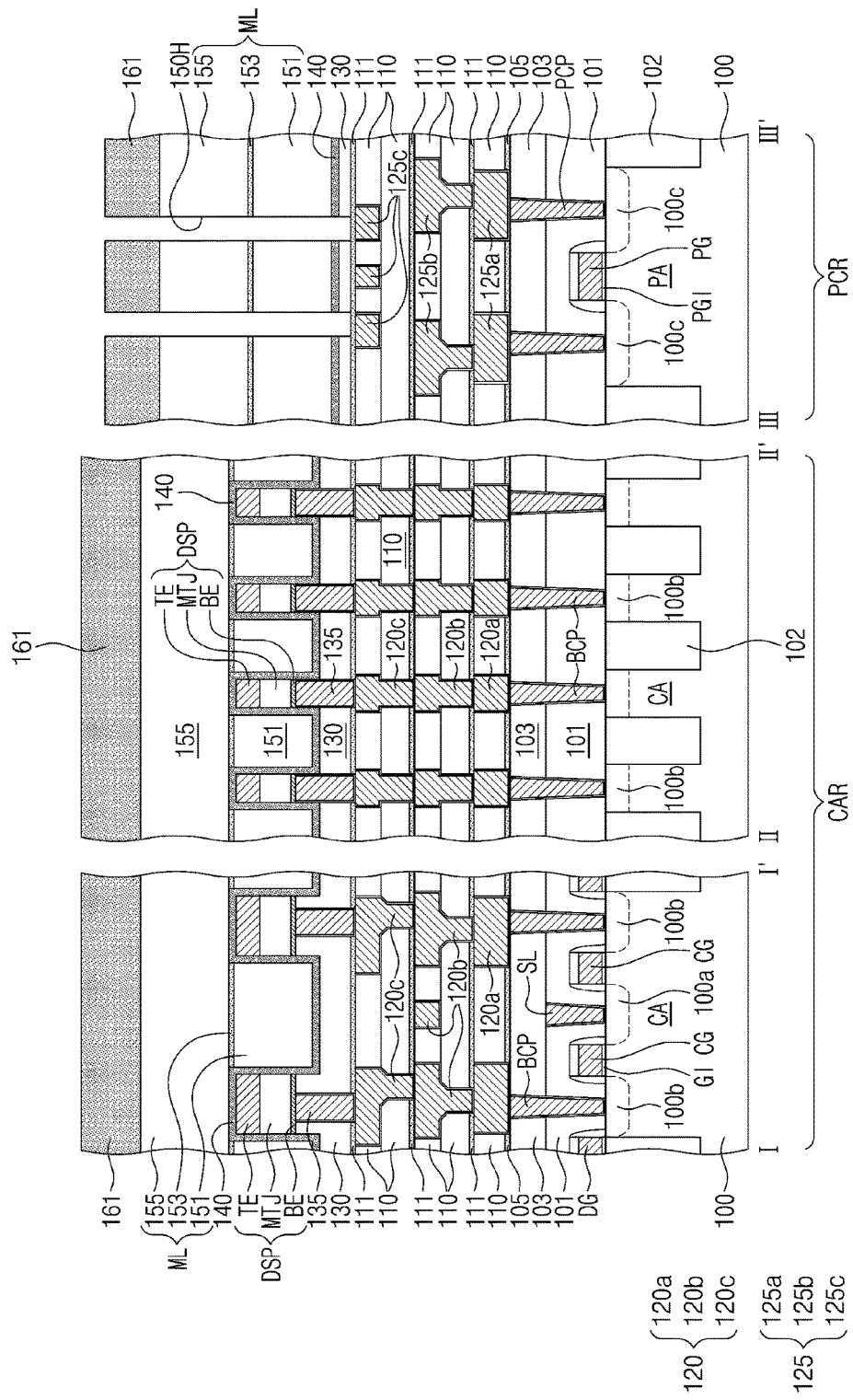

Referring to FIGS. 3 and 10, the mold layer ML, the protective insulating layer 140, and the upper dielectric layer 130 that are disposed on the peripheral region PCR may be patterned using the first hard mask pattern 161 as an etch mask to form preliminary peripheral via holes 150H. The preliminary peripheral via holes 150H may penetrate the second mold layer 155, the etching stopper layer 153, the first mold layer 151, the protective insulating layer 140, and the upper dielectric layer 130 to expose a portion of the uppermost layer of the diffusion preventing layers 111 that is disposed on the peripheral region PCR.

When forming the preliminary peripheral via holes 150H, a thickness of the first hard mask pattern 161 may be reduced. When forming the preliminary peripheral via holes 150H, since the second mold layer 155 that is disposed on the cell region CAR is covered by the first hard mask pattern 161, the thickness of the second mold layer 155 that is disposed on the cell region CAR need not change.

After forming the preliminary peripheral via holes 150H, the first hard mask pattern 161 on the second mold layer 155 may be removed.

Figure 11:
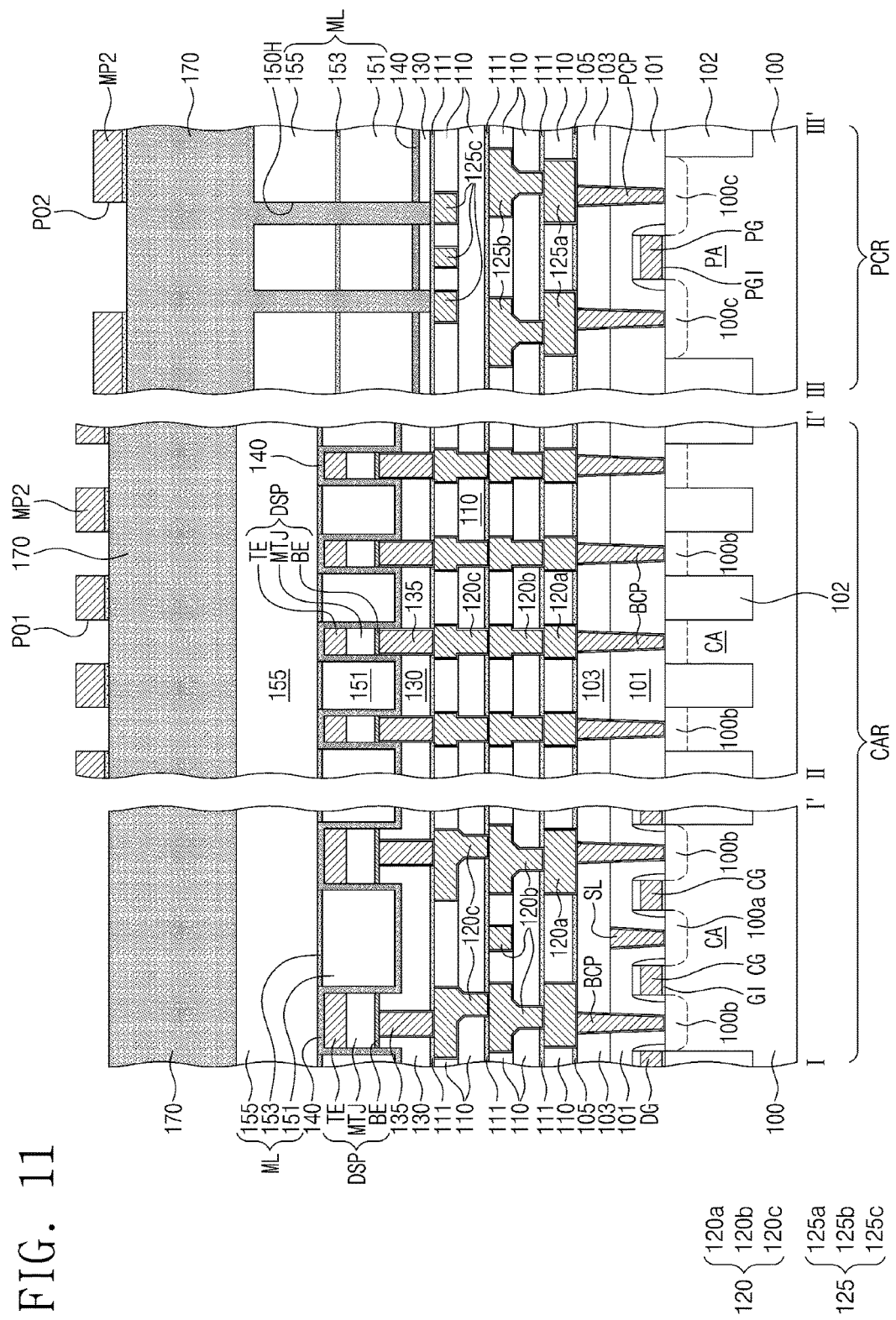

Referring to FIGS. 3 and 11, a second hard mask layer 170 filling the preliminary peripheral via holes 150H may be formed on the second mold layer 155. The second hard mask layer 170 may be formed of a material having etch selectivity with respect to the mold layer ML, the protective insulating layer 140, and the upper dielectric layer 130.

The second hard mask layer 170 may be formed of, for example, a spin-on hard mask (SOH) or an amorphous carbon layer (ACL). The spin-on hard mask (SOH) may include carbon-based SOH or a silicon-base SOH. The present inventive concept is not limited thereto. For example, the second hard mask layer 170 may be formed of amorphous silicon or polysilicon.

A second mask pattern MP2 may be formed on the second hard mask layer 170 to expose a portion of the cell region CAR and a portion of the peripheral region PCR.

The second mask pattern MP2 may include first preliminary openings PO1 having a linear shape extending in a first direction D1 across the cell gate electrodes CG on the cell region CAR. The second mask pattern MP2 may include a region that is disposed on the peripheral region PCR and may include a second preliminary opening PO2 having a bar or linear shape extending in the first direction D1, and overlapping the preliminary peripheral via holes 150H.

Figure 12:
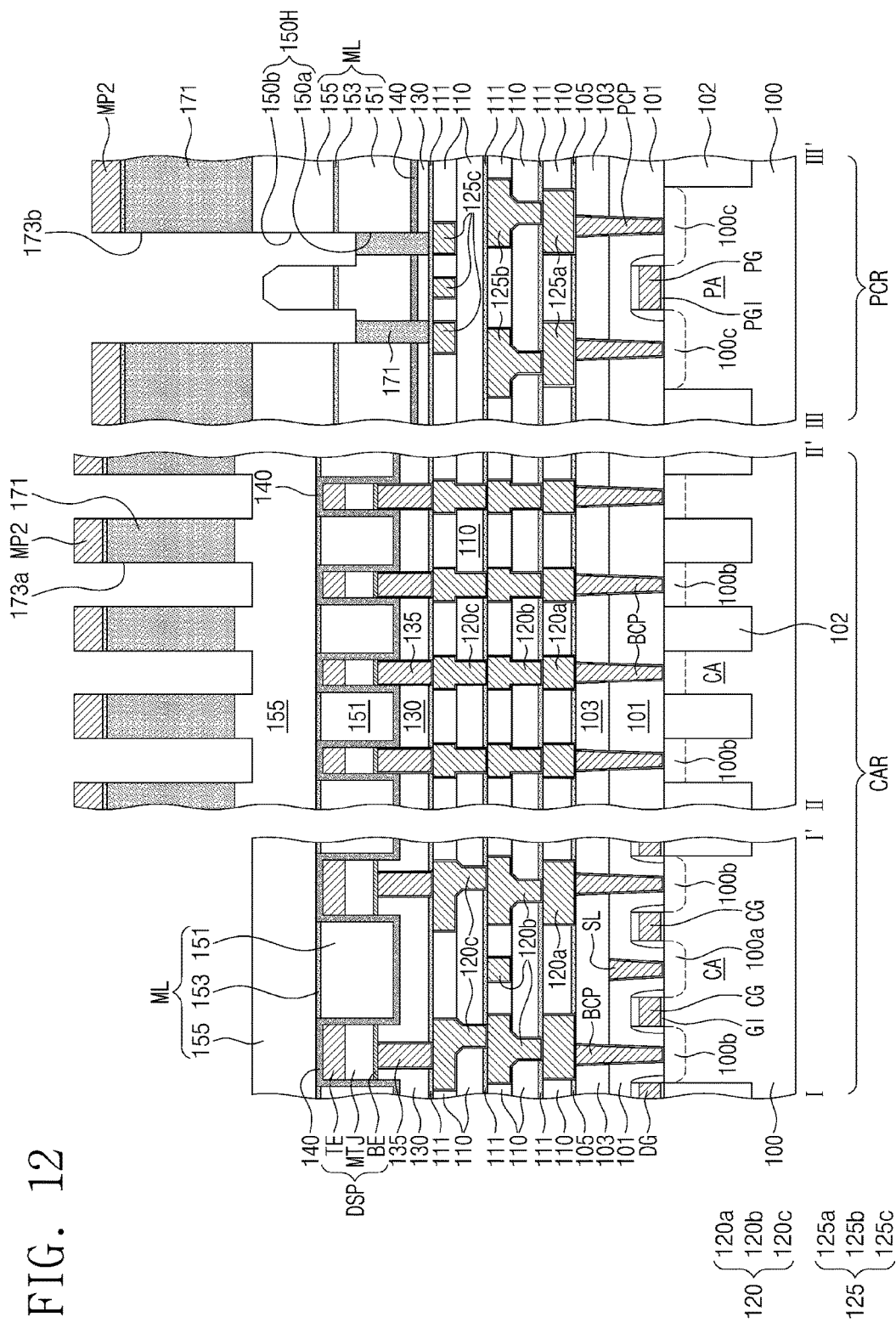

Referring to FIGS. 3 and 12, a portion of the second hard mask layer 170 may be etched using the second mask pattern MP2 as an etch mask to form a second hard mask pattern 171, exposing a portion of the second mold layer 155.

The second hard mask pattern 171 may include first openings 173*a* having a linear shape extending in the second direction D2 on the cell region CAR. On the peripheral region PCR, the second hard mask pattern 171 may include a second opening 173*b* connected vertically to the preliminary peripheral via holes 150H. The second opening 173*b* and the preliminary peripheral via hole 150H may expose a portion of the second mold layer 155 on the cell region CAR.

When forming the second hard mask pattern 171, a portion of the second hard mask layer 170 filled in the preliminary peripheral via holes 150H may be recessed. Additionally, when forming the second hard mask pattern 171, a portion of the second mold layer 155 exposed by the first openings 173*a* and the second openings 173*b* may be recessed due to over-etching. On the peripheral region PCR of the semiconductor substrate 100, a portion of the second hard mask pattern 171 may remain in the preliminary peripheral via holes 150H. In this case, a width of an upper portion 150*b* of each of the preliminary peripheral via holes 150H in which the second hard mask layer 170 is removed may increase compared to a width of a lower portion 150*a* thereof.

After forming the second hard mask pattern 171, the second mask pattern MP2 may be removed.

Figure 13:
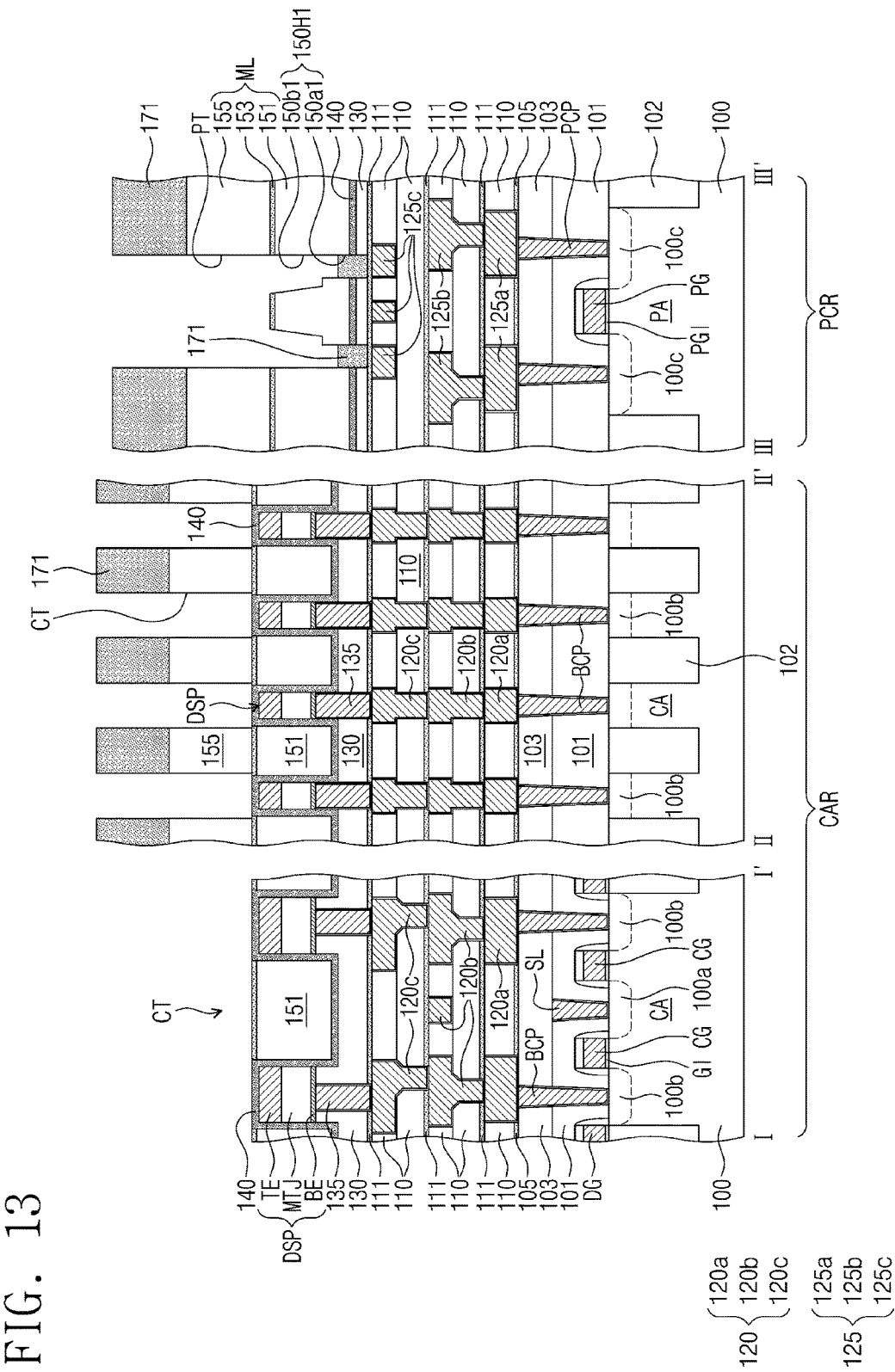

Referring to FIGS. 3 and 13, the second mold layer 155 and the first mold layer 151 may be patterned using the second hard mask pattern 171 as an etch mask to form cell trenches CT, peripheral trenches PT, and peripheral via holes 150H1. The cell trenches CT may be formed in the second mold layer 155 on the cell region CAR, and the peripheral trenches PT may be formed in the second mold layer 155 on the peripheral region PCR. The peripheral via holes 150H1 may be formed in the first mold layer 151 on the peripheral region PCR. The peripheral via holes 150H1 may penetrate the protective insulating layer 140 to be extended into the upper dielectric layer 130.

The cell trenches CT may expose the uppermost surface of the protective insulating layer 140 on the data storage patterns DSP. The peripheral trenches PT may be formed by etching the second mold layer 155. In an exemplary embodiment, an anisotropic etching process for forming the peripheral trenches PT may be performed such that a thickness or a width of the second mold layer 155 remaining between the peripheral trenches PT may be reduced. In an exemplary embodiment, when forming the peripheral trenches PT, a portion of the etching stopper layer 153 may be exposed within the peripheral via holes 150H1. In an exemplary embodiment, when forming the peripheral trenches PT, a portion of the first mold layer 151 exposed by the preliminary peripheral via holes 150H of FIG. 12 may be recessed to form the peripheral via holes 150H1.

Additionally, when forming the peripheral trenches PT, a thickness of the second hard mask pattern 171 remaining in the preliminary peripheral via holes 150H of FIG. 12 may be reduced. Sidewalls of the preliminary peripheral via holes 150H of FIG. 12 exposed by the second hard mask pattern 171 may also be etched such that the peripheral via holes 150H1 may have sloped sidewalls.

Each of the peripheral via holes 150H1 may include a lower portion 150a1 filled by the second hard mask pattern 171 and an upper portion 150b1 exposed by the second hard mask pattern 171. The upper portion 150b1 may have a width increasing in a direction away from the upper surface of the semiconductor substrate 100.

Figure 14:
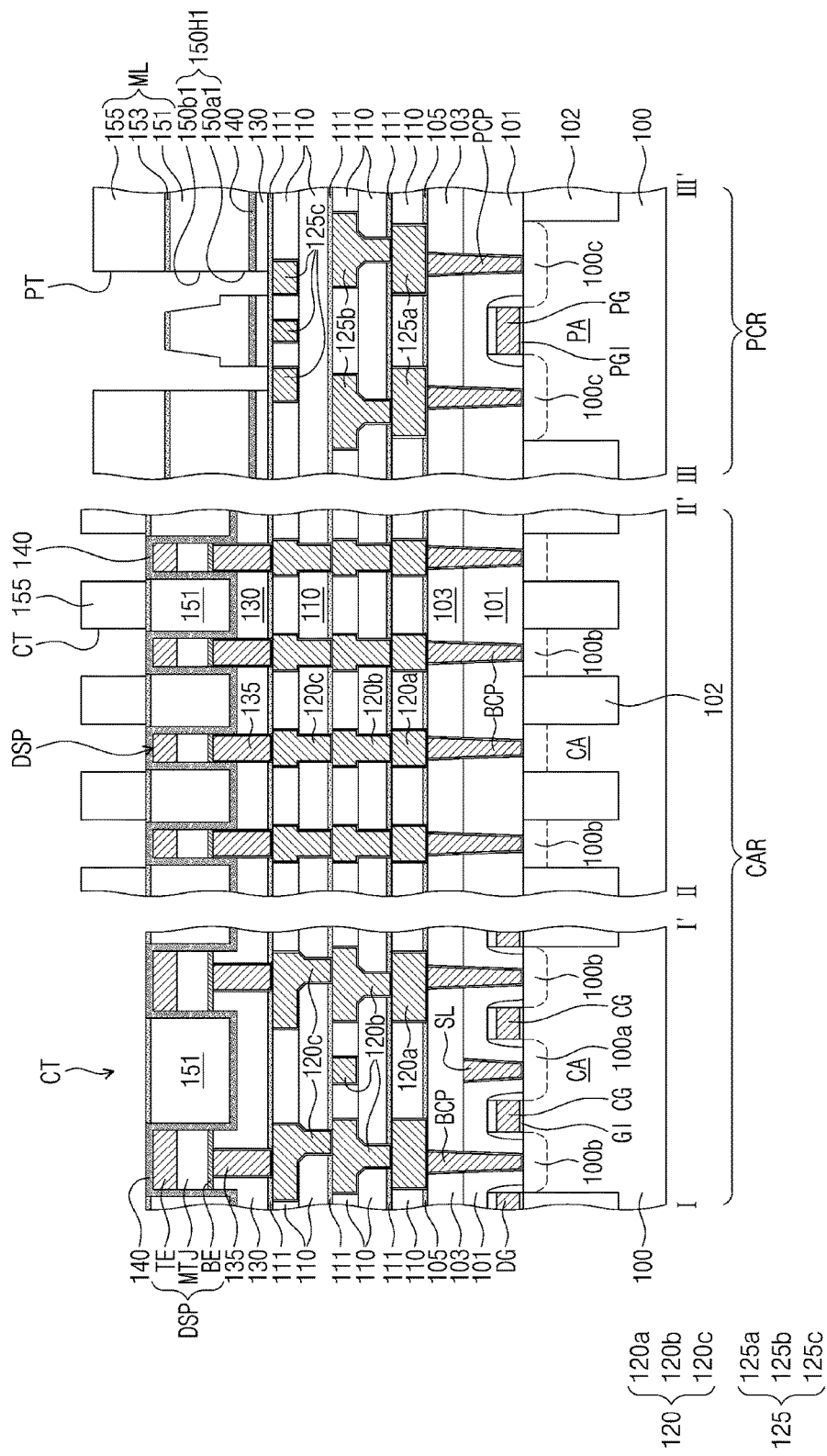

Referring to FIGS. 3 and 14, after forming the cell trenches CT and the peripheral trench PT, the second hard mask pattern 171 on the second mold layer 155 and in the peripheral via holes 150H1 may be removed. Thus, a portion of the uppermost layer of the diffusion preventing layers 111 may be exposed by the peripheral trench PT and the peripheral via holes 150H1.

Figure 15:
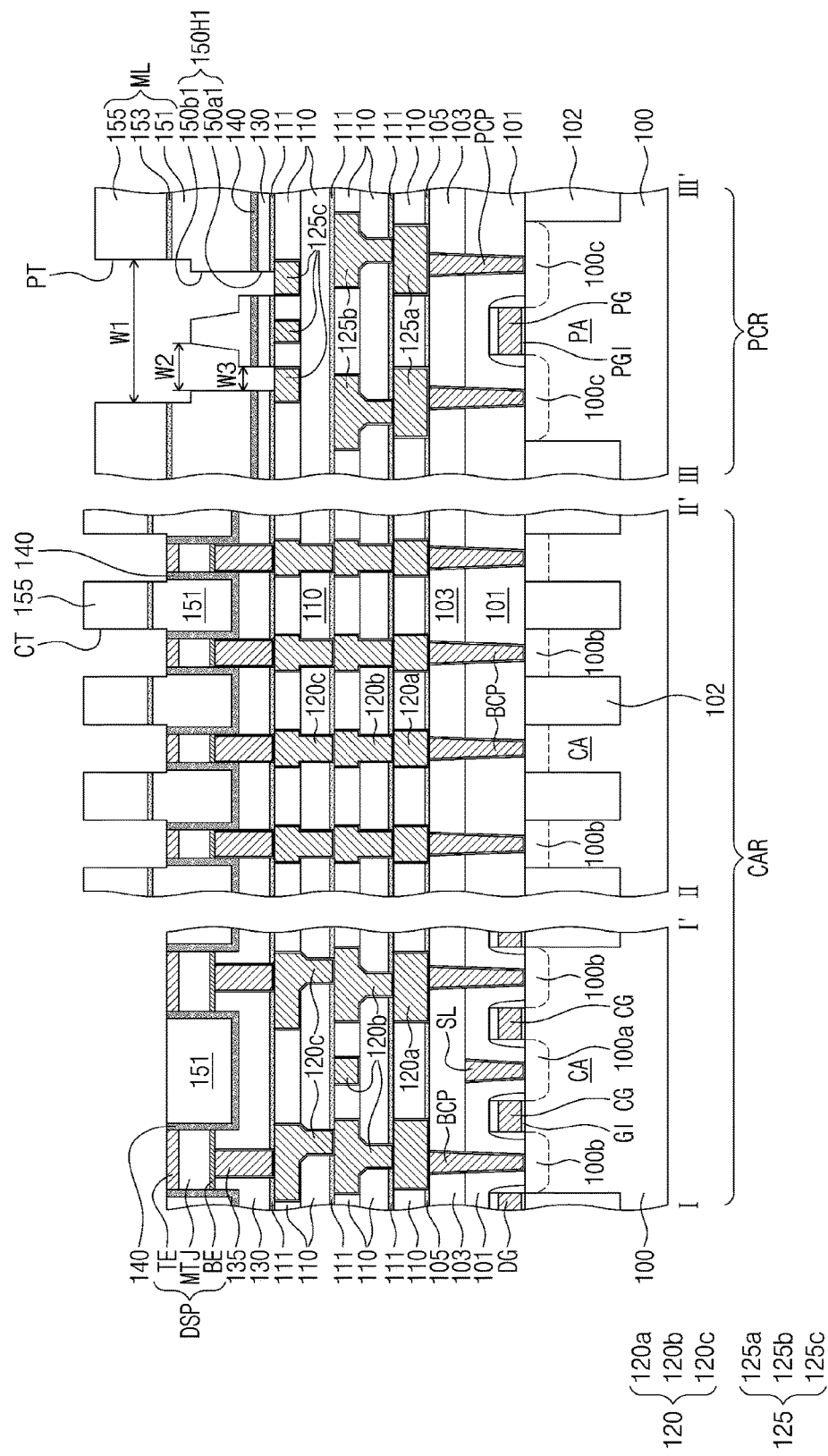

Referring to FIGS. 3 and 15, the protective insulating layer 140 exposed by the cell trenches CT may be anisotropically etched to expose the top electrode TE, and the uppermost layer of the diffusion preventing layers 111 exposed by the peripheral via holes 150H1 and the peripheral trenches PT may be anisotropically etched to expose the third peripheral lower wirings 125c.

When anisotropically etching the protective insulating layer 140, the upper surface of the top electrode TE may be recessed by over-etching. A portion of the etching stopper layer 153 and a portion of the first mold layer 151 exposed through the peripheral via holes 150H1 and the peripheral trenches PT may also be recessed. Therefore, a third thickness T3 (refer to FIG. 16) of the first mold layer 151 within each of the peripheral via holes 150H1 may be reduced such that an aspect ratio of each of the peripheral via hole 150H1 may be reduced.

In an exemplary embodiment, each of the peripheral trenches PT may have a first width W1, and each of the peripheral via holes 150H1 exposing the third peripheral lower wirings 125c may include the lower portion 150a1 having a third width W3 and the upper portion 150b1 having a second width W2 greater than the third width W3. The first width W1 may be greater than the first width W2 and the third width W3. A distance between the upper portions 150b1 of adjacent peripheral via holes 150H1 may decrease away from the upper surface of the semiconductor substrate 100.

Figure 16:
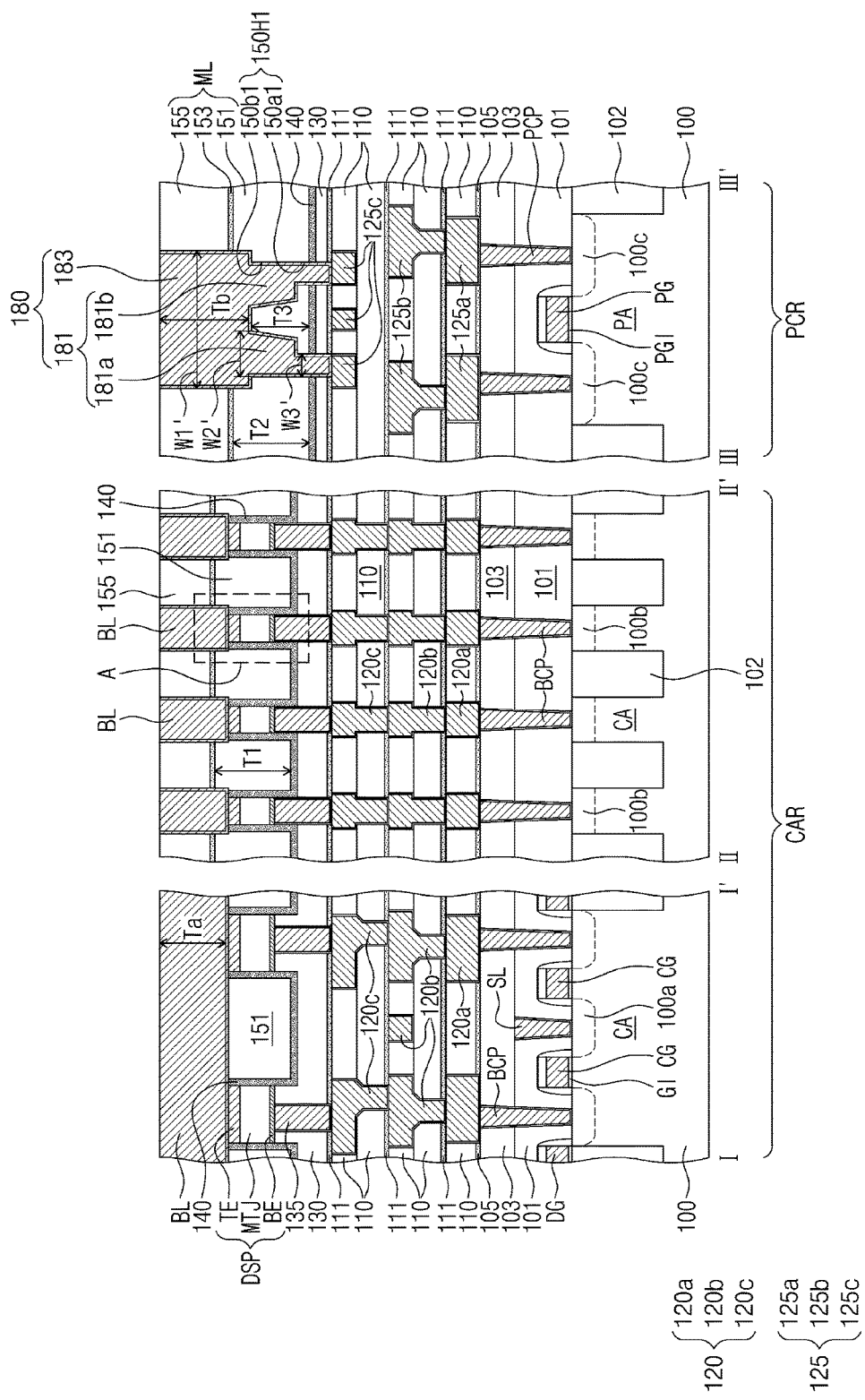
Figure 17A:
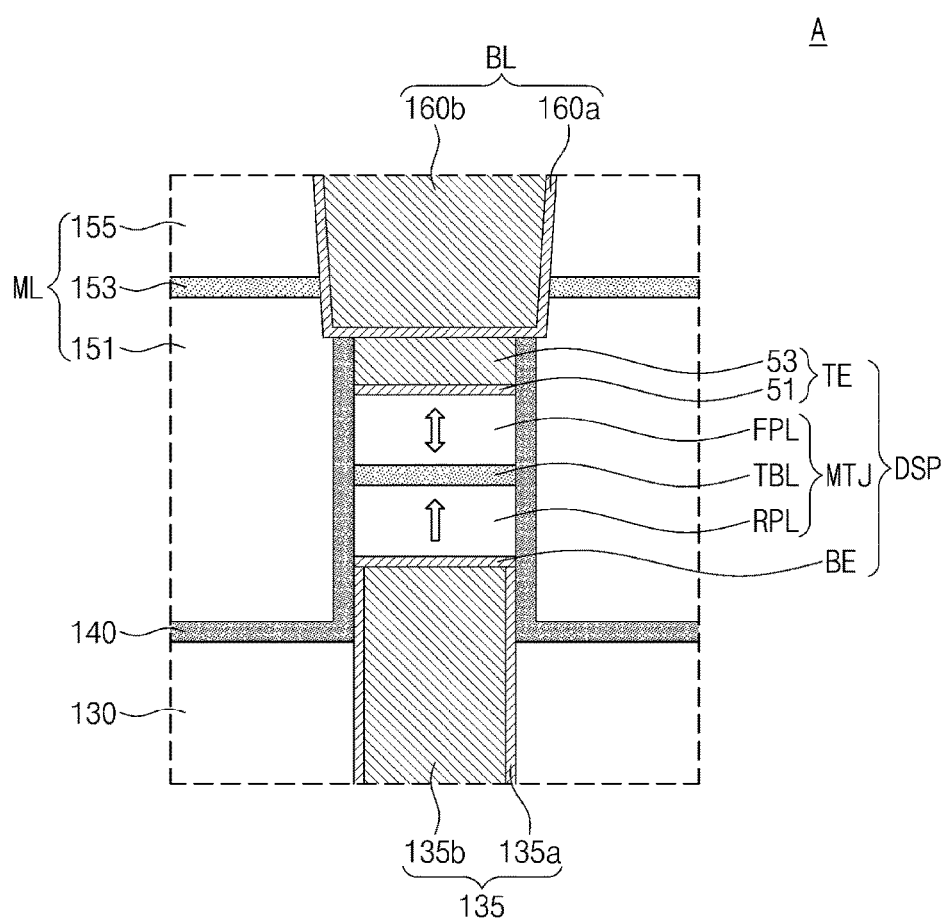
FIGS. 17A, 17B and 17C illustrate enlarged views of portion A of FIG. 16 according to an exemplary embodiment of the present inventive concept.
Figure 17B:
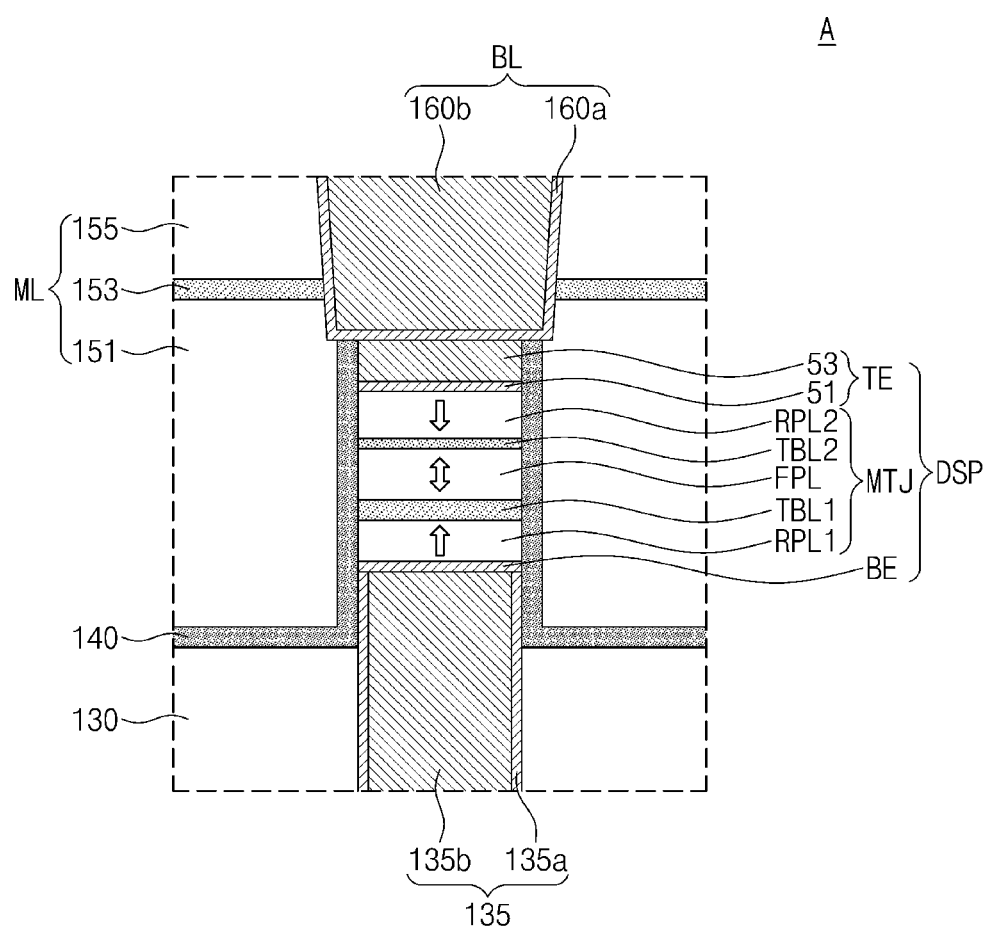
Figure 17C:
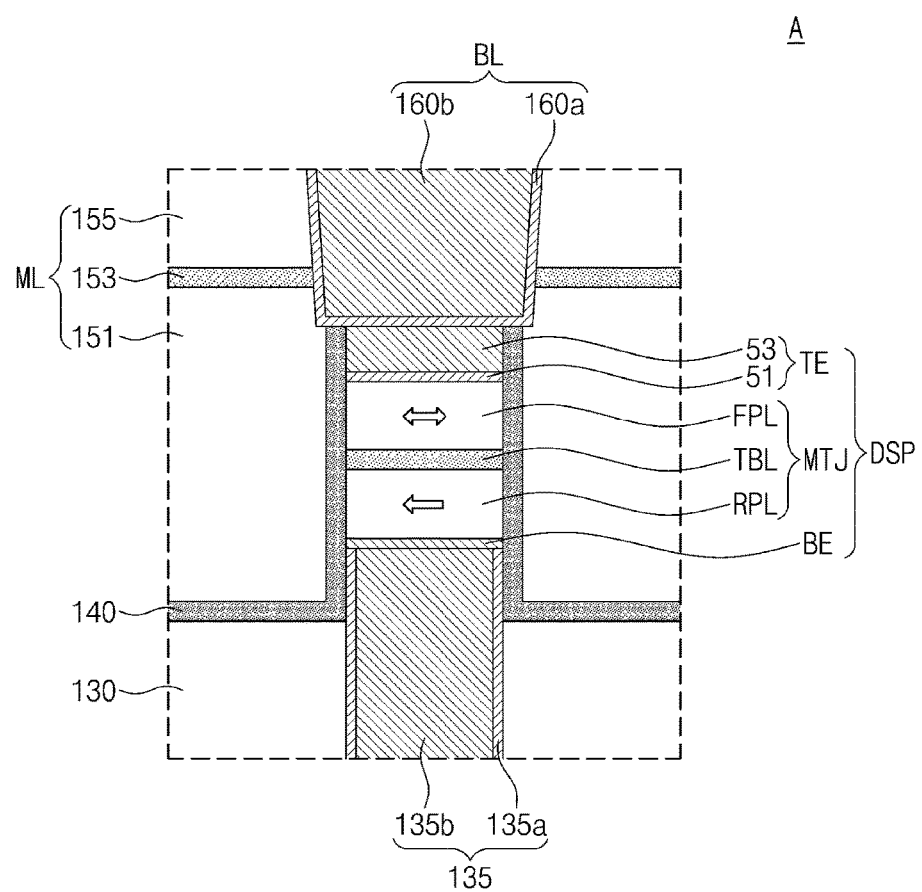

Referring to FIGS. 3 and 16, bit lines BL and a peripheral upper wiring 180 may be formed by depositing a conductive layer to fill the cell trenches CT, the peripheral via holes 150H1, and the peripheral trenches PT, then planarizing the conductive layer to expose the second mold layer 155.

The formations of the bit lines BL and the peripheral upper wiring 180 may include forming a barrier metal layer to conformally cover inner surfaces of the cell trenches CT, the peripheral via holes 150H1, and the peripheral trench PT; forming a metal layer to fill the cell trenches CT, the peripheral via holes 150H1, and the peripheral trench PT, in which the barrier metal layer is formed; and planarizing the barrier metal layer and the metal layer to expose the upper surface of the second mold layer 155. Thus, the bit lines BL may each include a barrier metal pattern 160a and a metal pattern 160b as shown in FIGS. 17A to 17C.

In an exemplary embodiment, since the width of the upper portion 150b1 of each of the peripheral via holes 150H1 adjacent the peripheral trench PT increases away from the upper surface of the semiconductor substrate 100, the peripheral via holes 150H1 and the peripheral trench PT may be filled with metal without forming voids.

The bit lines BL and the peripheral upper wiring 180 may be concurrently formed.

The bit lines BL may extend in the first direction D1 across the cell gate electrodes CG. The peripheral upper wiring 180 may include via portions 181 penetrating the first mold layer 151 to be in contact with the third peripheral lower wirings 125c and a wiring portion 183 connecting the via portions 181. For example, the peripheral upper wiring 180 may include the wiring portion 183 and the via portions 181 extending downwardly from a bottom surface of the wiring portion 183. The via portions 181 may include a first via portion 181a and a second via portion 181b separated from each other. The peripheral upper wiring 180 may be electrically connected to the peripheral lower wirings 125.

The wiring portion 183 may have a first width W1'.

The via portions 181 may each include a lower portion having a third width W3' and an upper portion having a second width W2' greater than the third width W3'. The second width W2' of the upper portion of each via portion 181 may increase away from the upper surface of the semiconductor substrate 100. A distance between the first via portion 181a and the second via portion 181b may decrease in a direction from a lower surface of the first mold layer 151 to the upper surface of the first mold layer 151. The upper surface of the first mold layer 151, between the first via portion 181a and the second via portion 181b, may be lower than lower surfaces of the bit lines BL with respect to the upper surface of the semiconductor substrate 100. The upper surface of the first mold layer 151, between the first via portion 181a and the second via portion 181b, may be lower than an upper surface of the first mold layer 151 surrounding the wiring portion 183, with respect to the upper surface of the semiconductor substrate 100. The peripheral upper wiring 180 may include an inner sidewall defined by the first via portion 181a, the second via portion 181b, and the bottom surface of the wiring portion 183, as well as an outer sidewall defined by a sidewall of the wiring portion 183 and sidewalls of the via portions 181 connected to the sidewall of the wiring portion 183. The upper surface of the first mold layer 151, covering the inner sidewall of the peripheral upper wiring 180, may be lower than the upper surface of the first mold layer 151 covering the outer sidewall of the peripheral upper wiring 180.

The bit lines BL may each have a first thickness Ta. The wiring portion 183 of the peripheral upper wiring 180 may have a second thickness Tb greater than the first thickness Ta.

In an exemplary embodiment, the bit lines BL and the peripheral upper wiring 180 may include a fourth metal material. The fourth metal material may be different from the third metal material. The fourth metal material may have a resistivity lower than that of the third metal material. The fourth metal material may include, for example, a conductive metal such as aluminum, tungsten, titanium, and tantalum, or a combination thereof, and a conductive metal nitride such as titanium nitride, tantalum nitride, and tungsten nitride, or a combination thereof. In an exemplary embodiment, the conductive metal of the fourth metal material may be used to form the metal pattern 160*b* of each of the bit lines BL, and the conductive metal nitride of the fourth metal material may be used to form the barrier metal pattern 160*a* of each of the bit lines BL. The present inventive concept is not limited thereto. For example, the bit lines BL and the peripheral upper wiring 180 may include the same material as the cell lower wirings 120 and the peripheral lower wirings 125.

In an exemplary embodiment, a stacked structure of one of the lower contact plugs 135, the first data storage pattern DSP, and the bit line BL may penetrate the mold layer ML and the upper dielectric layer 130 so that the stacked structure is connected to the cell lower wirings 120. A thickness of the stacked structure may be the same as a thickness of the peripheral upper wiring 180.

In an exemplary embodiment, the wiring portion 183 has the first width W1'. The via portions 181 may include at least two via portions 181*a* and 181*b*. Each of the at least two via portions 181*a* and 181*b* may include a first portion having a second width W2' decreasing downwardly from the bottom surface of the wiring portion 183 toward the peripheral lower wirings 125. Each of the at least two via portions 181*a* and 181*b* may further include a second portion having the third width W3' smaller than a minimum width of the second width W2'.

In an exemplary embodiment, the bit line BL and the peripheral upper wiring 180 may be formed of substantially the same metal material including a metal or a metal nitride. In an exemplary embodiment, the cell lower wirings 120 and the peripheral lower wirings 125 may be formed of substantially the same metal material including copper or a copper alloy. In an exemplary embodiment, a resistivity of the cell lower wirings 120 may be smaller than a resistivity of the bit line BL. In an exemplary embodiment, a resistivity of the peripheral lower wirings 125 may be smaller than a resistivity of the peripheral upper wiring 180.

FIGS. 18 to 21 are cross-sectional views taken along lines I-I', II-II' and of FIG. 3 to illustrate a method of manufacturing a semiconductor memory device according to an exemplary embodiment. In FIGS. 18 to 21, the same reference numerals are used to denote the same elements as in FIGS. 4 to 16, and thus repeated descriptions thereof will be omitted.

Figure 18:
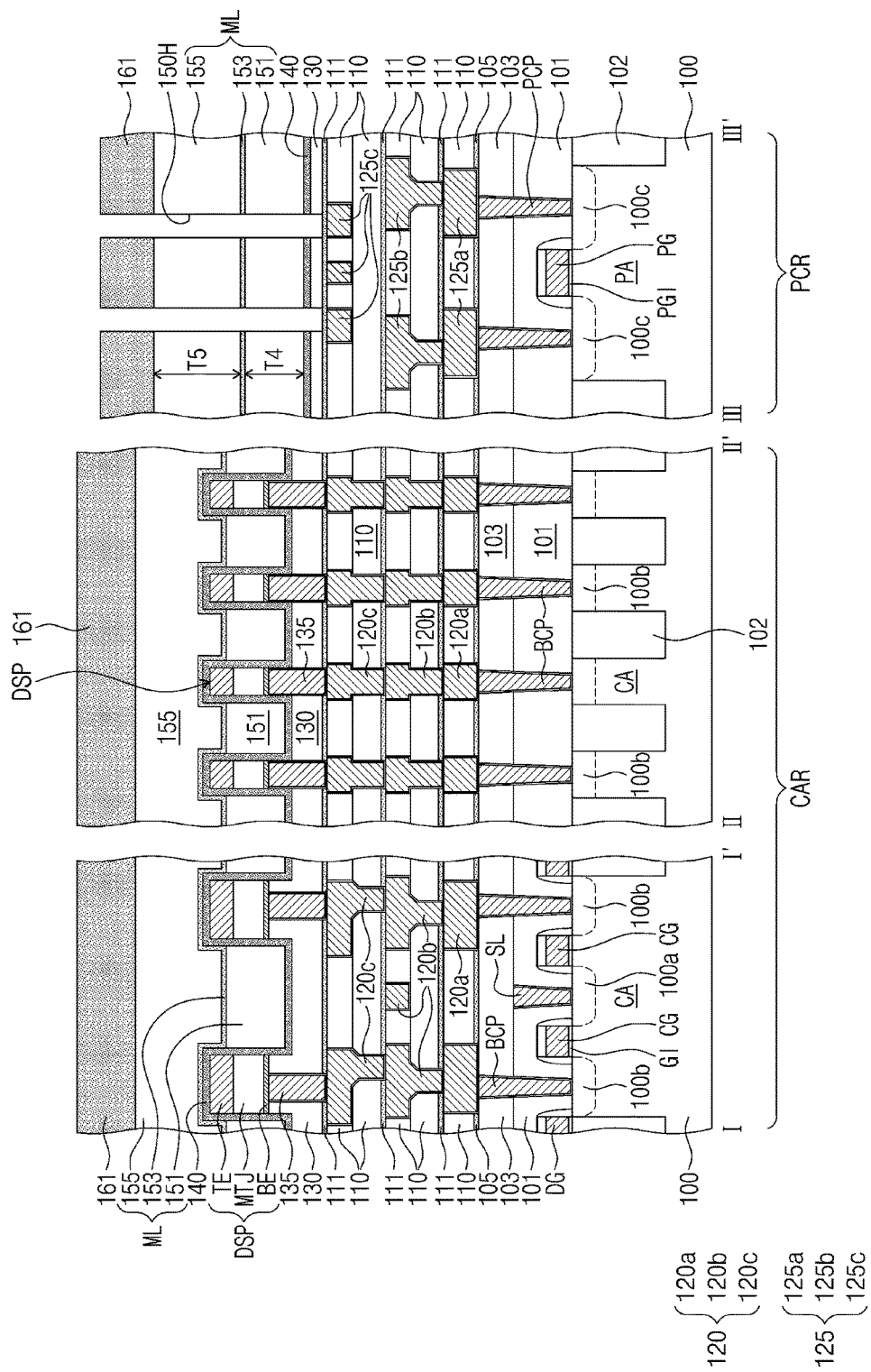
FIGS. 18 to 21 are cross-sectional views taken along lines I-I', II-II' and of FIG. 3 to illustrate a method of manufacturing a semiconductor device according to an exemplary embodiment of the present inventive concept.

Referring to FIGS. 3 and 18, after forming the data storage patterns DSP on the cell region CAR, the protective insulating layer 140 may be conformally formed on the semiconductor substrate 100.

The mold layer ML including the first mold layer 151, the etching stopper layer 153, and the second mold layer 155 that are sequentially stacked on the protective insulating layer 140 may be formed. In an exemplary embodiment, a thickness T4 of the first mold layer 151 may be smaller than a thickness T5 of the second mold layer 155. An upper surface of the first mold layer 151 may be higher on the cell region CAR than on the peripheral region PCR, with respect to an upper surface of the semiconductor substrate 100. The upper surface of the first mold layer 151 that is disposed on the peripheral region PCR may be lower than upper surfaces of the data storage patterns DSP with respect to the upper surface of the semiconductor substrate 100.

The first hard mask pattern 161 may be formed on the mold layer ML. The mold layer ML, the protective insulating layer 140, and the upper dielectric layer 130 may be etched using the first hard mask pattern 161 as an etch mask to form the preliminary peripheral via holes 150H. After forming the preliminary peripheral via holes 150H, the first hard mask pattern 161 may be removed.

Figure 19:
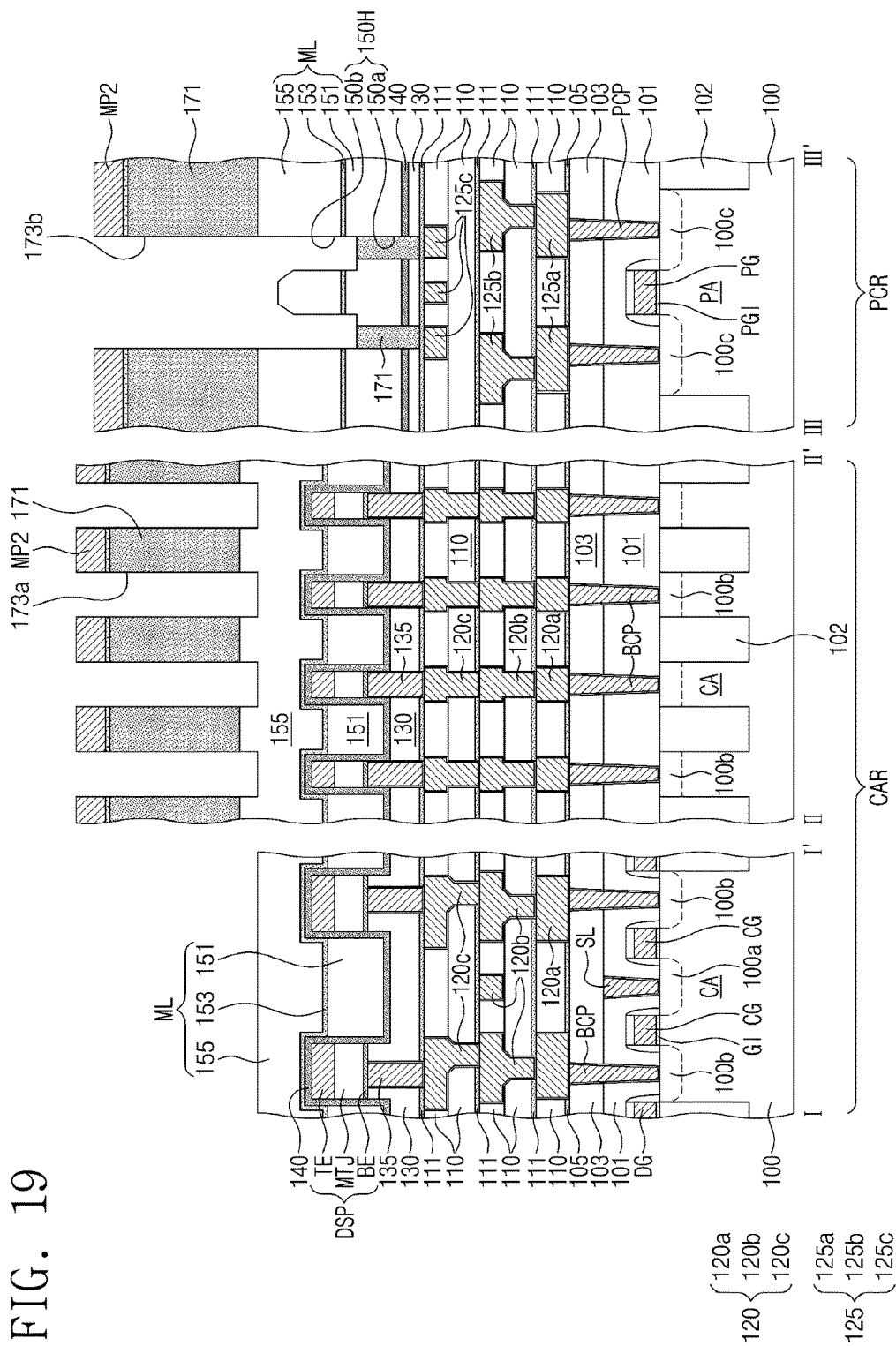

Referring to FIGS. 3 and 19, as described in FIGS. 11 and 12, the second hard mask pattern 171 may be formed on the second mold layer 155 to expose a portion of the second mold layer 155. The second hard mask pattern 171 may include the first openings 173*a* on the cell region CAR and the second opening 173*b* on the peripheral region PCR.

When forming the second hard mask pattern 171, a portion of the second hard mask layer 170 (refer to FIG. 11) filled in the preliminary peripheral via holes 150H may be recessed such that a portion of the second hard mask pattern 171 may remain in the preliminary peripheral via holes 150H. The upper portions 150*b* of the preliminary peripheral via holes 150H, exposed by recessing the second hard mask layer 170, may increase in width compared to the lower portions 150*a* thereof.

Figure 20:
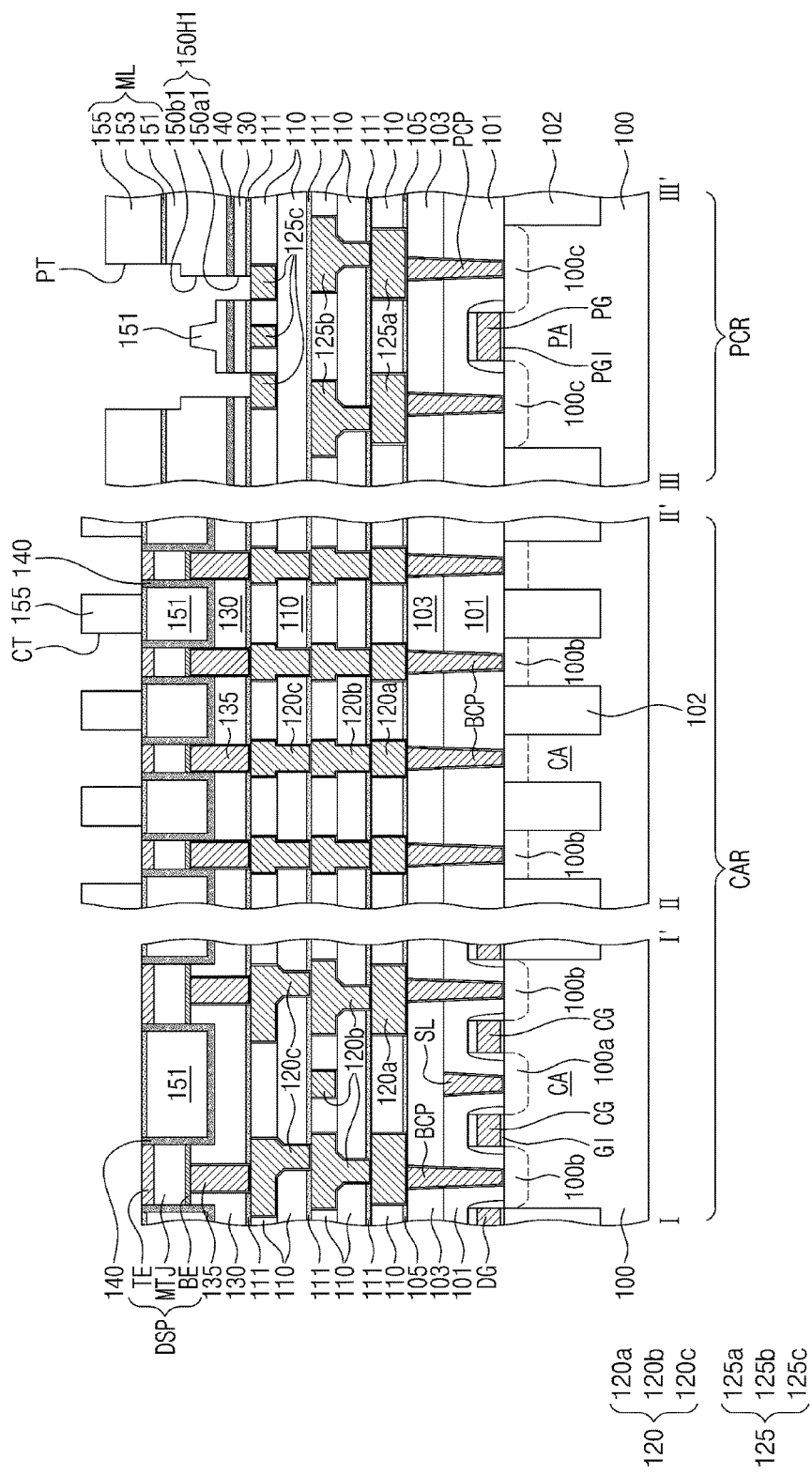

Referring to FIGS. 3 and 20, as described in FIG. 13, the cell trenches CT may be formed in the second mold layer 155 on the cell region CAR, and the peripheral trench PT may be formed in the second mold layer 155 on the peripheral region PCR.

The cell trenches CT and the peripheral trench PT may be formed by anisotropically etching the second mold layer 155 using the second hard mask pattern 171 as an etch mask to expose the top electrodes TE of the data storage patterns DSP.

When forming the peripheral trench PT, a portion of the upper surface of the first mold layer 151 may be recessed, and thus widths of the upper portions 150*b*1 of the peripheral via holes 150H1 may increase.

When forming the peripheral trench PT, a portion of the upper surface of the first mold layer 151 may be recessed such that aspect ratios of the peripheral via holes 150H1 may be reduced. In an exemplary embodiment, a thickness of the first mold layer 151 may be smaller on the cell region PCR than on the cell region CAR. Furthermore, the upper surface of the first mold layer 151, disposed within the peripheral via holes 150H1, may be positioned at a level between an upper surface of one of the lower contact plugs 135 and a lower surface of the one of the lower contact plugs 135.

Figure 21:
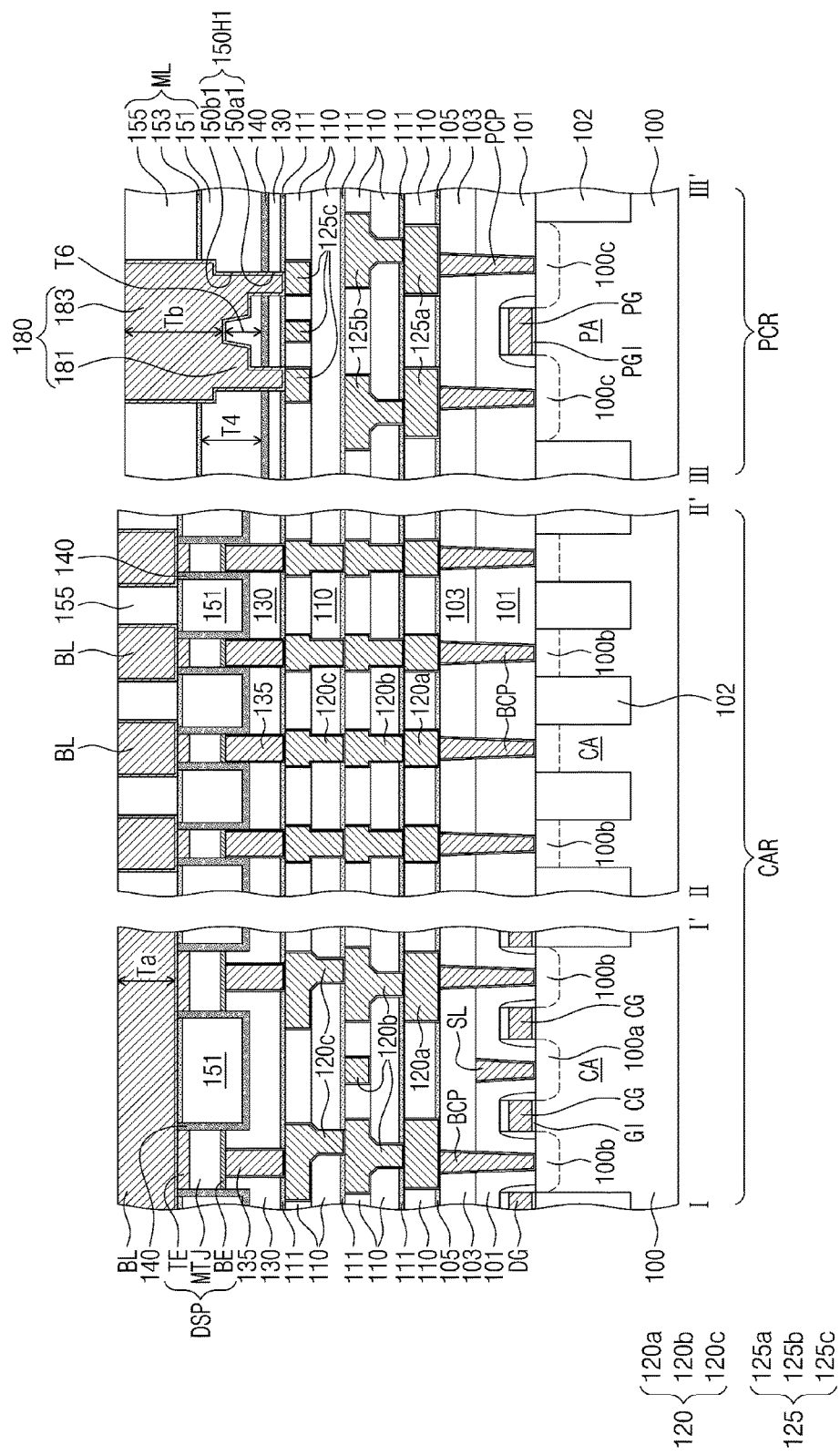

Referring to FIGS. 3 and 21, as described in FIG. 16, the bit lines BL may be formed in the cell trenches CT to be in contact with the top electrodes TE of the data storage patterns DSP, respectively, while the peripheral upper wiring 180 may be formed in the peripheral via holes 150H1 and the peripheral trench PT.

The bit lines BL and the peripheral upper wiring 180 may be concurrently formed. The bit lines BL may have a first thickness Ta. The wiring portion 183 of the peripheral upper wiring 180 may have a second thickness Tb greater than the first thickness Ta. In an exemplary embodiment, a lower surface of the wiring portion 183 of the peripheral upper wiring 180 may be lower than lower surfaces of the bit lines BL with respect to the upper surface of the semiconductor substrate 100. In an exemplary embodiment as shown in FIG. 21, the lower surface of the wiring portion 183 of the peripheral upper wiring 180 may be higher than lower surfaces of the lower contact plugs 135. The present inventive concept is not limited thereto. For example, unlike FIG. 21, the lower surface of the wiring portion 183 of the peripheral upper wiring 180 may be lower than the lower surfaces of the lower contact plugs 135.

According to an exemplary embodiment of the present inventive concept, on the peripheral region PCR, the peripheral lower wirings 125, and the peripheral upper wiring 180 may be formed of the metal having the resistivity lower than the lower contact plugs 135 such that a RC delay of electrical signals through the peripheral lower wirings 125 and the peripheral upper wiring 180 may be reduced.

Additionally, the peripheral upper wiring 180 that is thicker than each bit line BL is formed along with the bit lines BL, and aspect ratios of the peripheral via holes 150H1 may be reduced on the peripheral region PCR. Therefore, when forming the peripheral upper wiring 180 by a dual-damascene process, it may be advantageous to fill the peripheral via holes 150H and the peripheral trench PT with metal.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device comprising:
   a semiconductor substrate including a cell region and a peripheral region;
   a lower dielectric layer disposed on the cell region and the peripheral region of the semiconductor substrate;
   a cell lower wiring disposed on the cell region and in the lower dielectric layer;
   a plurality of peripheral lower wirings disposed on the peripheral region and in the lower dielectric layer;
   a diffusion preventing layer disposed on the cell region and the peripheral region and covering the cell lower wiring and the lower dielectric layer;
   an upper dielectric layer disposed on the diffusion preventing layer on the cell region and the peripheral region and covering the cell lower wiring and the plurality of peripheral lower wirings;
   a lower contact plug penetrating the upper dielectric layer and the diffusion preventing layer to be connected to the cell lower wiring;
   a data storage pattern connected to the lower contact plug;
   a mold layer disposed on the upper dielectric layer in the cell region and the peripheral region, wherein the mold layer includes an etching stopper layer;
   a protective insulating layer disposed between the mold layer and the upper dielectric layer in the cell region and the peripheral region; and
   a peripheral upper wiring penetrating the protective insulating layer, the mold layer and the upper dielectric layer to be connected to at least one of the plurality of peripheral lower wirings,
   wherein the peripheral upper wiring includes a wiring portion, a first via portion extending downwardly from a bottom surface of the wiring portion, and a second via portion extending downwardly from the bottom surface of the wiring portion,
   wherein the bottom surface of the wiring portion is lower than the etching stopper layer of the mold layer,
   wherein a bottom surface of the peripheral upper wiring is located at the same level as a bottom surface of the lower contact plug,
   wherein a first portion of the protective insulating layer on the cell region is spaced apart from a first portion of the diffusion preventing layer on the cell region by a first distance,
   wherein a second portion of the protective insulating layer on the peripheral region is spaced apart from a second portion of the diffusion preventing layer on the peripheral region by a second distance, and
   wherein the second distance is less than the first distance.

2. The semiconductor memory device of claim 1, further comprising:
   wherein the first via portion and the second via portion are in contact with one of the plurality of peripheral lower wirings and another one of the plurality of peripheral lower wirings, respectively,
   wherein each of the first via portion and the second via portion includes a lower portion and an upper portion connecting the lower portion to the wiring portion,
   wherein a width of the upper portion is greater than a width of the lower portion.

3. The semiconductor memory device of claim 2,
   wherein a bit line has a first thickness, and
   wherein a thickness of the wiring portion of the peripheral upper wiring is greater than a thickness of the bit line.

4. The semiconductor memory device of claim 2,
   wherein a lower surface of the wiring portion of the peripheral upper wiring is lower than an upper surface of the data storage pattern.

5. The semiconductor memory device of claim 2,
   wherein a distance between the upper portion of the first via portion and the upper portion of the second via portion decreases upwardly from a lower surface of the mold layer to an upper surface of the mold layer.

6. The semiconductor memory device of claim 5,
   wherein the mold layer further includes a first mold layer and a second mold layer so that the etching stopper layer is disposed between the first mold layer and the second mold layer,
   wherein the second mold layer covers a sidewall of the wiring portion of the peripheral upper wiring, and
   wherein a thickness of the first mold layer covering an inner sidewall of the peripheral upper wiring is smaller than a thickness of the first mold layer covering an outer sidewall of the peripheral upper wiring.

7. The semiconductor memory device of claim 1,
   wherein an upper surface of the upper dielectric layer disposed on the cell region of the semiconductor substrate is higher than an upper surface of the upper dielectric layer disposed on the peripheral region of the semiconductor substrate.

8. The semiconductor memory device of claim 1, further comprising:
   wherein at least a portion of an upper surface of the upper dielectric layer disposed on the cell region of the semiconductor substrate is lower than an upper surface of the lower contact plug.

9. The semiconductor memory device of claim 1,
   wherein a lower surface of the peripheral upper wiring is in contact with at least one of the plurality of peripheral lower wirings, and
   wherein the lower surface of the peripheral upper wiring is lower than an upper surface of the lower contact plug.

10. The semiconductor memory device of claim 1, wherein:
    the protective insulating layer is disposed between a sidewall of the data storage pattern and the mold layer on the cell region, and between the upper dielectric layer and the mold layer on the peripheral region,
    wherein the protective insulating layer is formed of an insulating material different from the upper dielectric layer and the mold layer.

11. The semiconductor memory device of claim 1,
    wherein the data storage pattern includes a bottom electrode, a lower magnetic pattern, a tunnel barrier pattern, an upper magnetic pattern, and a top electrode, stacked as listed, on the lower contact plug.

12. A semiconductor memory device comprising:
a semiconductor substrate including a cell region and a peripheral region;
a lower dielectric layer disposed on the cell region and the peripheral region of semiconductor substrate;
a peripheral lower wiring disposed on the peripheral region of the semiconductor substrate and in the lower dielectric layer;
a cell lower wiring in the cell region;
a diffusion preventing layer disposed on the cell region and the peripheral region and covering the cell lower wiring and the lower dielectric layer;
a lower contact plug disposed on the cell region and penetrating the diffusion preventing layer and the lower dielectric layer;
a data storage pattern connected to the lower contact plug;
a protective insulating layer disposed on the lower dielectric layer and on the cell region and the peripheral region;
an etching stopper layer disposed on the protective insulating layer; and
a peripheral upper wiring disposed on the peripheral lower wiring,
wherein the protective insulating layer is between the lower dielectric layer and the etching stopper layer and covers a sidewall of the data storage pattern,
wherein the peripheral upper wiring penetrates the etching stopper layer and the protective insulating layer, and
wherein the peripheral upper wiring includes a wiring portion and at least two via portions extended downwardly from a bottom surface of the wiring portion toward the peripheral lower wiring,
wherein a first portion of the protective insulating layer on the cell region is spaced apart from a first portion of the diffusion preventing layer on the cell region by a first distance,
wherein a second portion of the protective insulating layer on the peripheral region is spaced apart from a second portion of the diffusion preventing layer on the peripheral region by a second distance, and
wherein the second distance less than the first distance.

13. The semiconductor memory device of claim 12,
wherein the wiring portion having a first width penetrates the etching stopper layer, and
wherein the at least two via portions penetrate the protective insulating layer.

14. The semiconductor memory device of claim 13,
wherein each of the at least two via portions includes a first portion having a second width decreasing downwardly from the bottom surface of the wiring portion toward the peripheral lower wiring, and
wherein each of the at least two via portions further includes a second portion having a third width smaller than a minimum width of the second width.

15. A semiconductor memory device comprising:
a semiconductor substrate including a cell region and a peripheral region;
a cell lower wiring on the cell region;
a first peripheral lower wiring on the peripheral region;
a diffusion preventing layer disposed on the cell region and the peripheral region and covering the cell lower wiring and the first peripheral lower wiring;
an interlayer insulating layer covering the diffusion preventing layer;
a lower contact plug penetrating the interlayer insulating layer to be connected to the cell lower wiring;
a first data storage pattern connected to the lower contact plug;
a mold layer on the interlayer insulating layer to cover the first data storage pattern;
a protective insulating layer disposed between the mold layer and the interlayer insulating layer and on the cell region and the peripheral region;
a bit line penetrating the mold layer in the cell region to be connected to the first data storage pattern; and
a peripheral upper wiring penetrating the mold layer in the peripheral region to be connected to the first peripheral lower wiring,
wherein the lower contact plug includes a first metal material, and the bit line and the peripheral upper wiring include a second metal material having a resistivity lower than a resistivity of the first metal material,
wherein a first portion of the protective insulating layer on the cell region is spaced apart from a first portion of the diffusion preventing layer on the cell region by a first distance,
wherein a second portion of the protective insulating layer on the peripheral region is spaced apart from a second portion of the diffusion preventing layer on the peripheral region by a second distance, and
wherein the second distance is less than the first distance.

16. The semiconductor memory device of claim 15, wherein the cell lower wiring and the first peripheral lower wiring include the second metal material.

17. The semiconductor memory device of claim 15, further comprising:
a second peripheral lower wiring adjacent to the first peripheral lower wiring,
wherein the peripheral upper wiring includes via portions and a wiring portion connecting the via portions, and
wherein the via portions are in contact with the first and second peripheral lower wirings, respectively,
wherein each of the via portions includes a lower portion having a first width and an upper portion connecting the lower portion to the wiring portion and having a second width greater than the first width.

18. The semiconductor memory device of claim 17, wherein a lower surface of the wiring portion of the peripheral upper wiring is lower than an upper surface of the first data storage pattern.

19. The semiconductor memory device of claim 15, wherein a bottom surface of the peripheral upper wiring is located at the same level as a bottom surface of the lower contact plug.

20. The semiconductor memory device of claim 15, wherein the peripheral upper wiring includes a wiring portion, a first via portion extending downwardly from a bottom surface of the wiring portion, and a second via portion extending downwardly from the bottom surface of the wiring portion, and
wherein the mold layer includes a first mold layer, an etching stopper layer and a second mold layer, and
the first mold layer is thicker around the wiring portion of the peripheral upper wiring than between the first and second via portions of the peripheral upper wiring.

* * * * *